US008766897B2

(12) United States Patent
Yoshida et al.

(10) Patent No.: US 8,766,897 B2
(45) Date of Patent: Jul. 1, 2014

(54) MATRIX SUBSTRATE AND DISPLAY WHICH INPUTS SIGNAL-POLARITY INVERTING SIGNALS TO PICTURE DATA

(75) Inventors: Daisuke Yoshida, Ebina (JP); Katsumi Kurematsu, Hiratsuka (JP); Osamu Koyama, Tokyo (JP); Mamoru Miyawaki, Isehara (JP); Koichi Yamagishi, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 2057 days.

(21) Appl. No.: 11/338,531

(22) Filed: Jan. 23, 2006

(65) Prior Publication Data

US 2006/0132420 A1    Jun. 22, 2006

Related U.S. Application Data

(62) Division of application No. 08/953,719, filed on Oct. 17, 1997, now abandoned.

(30) Foreign Application Priority Data

Oct. 16, 1996 (JP) ........................ 8-276531
Oct. 13, 1997 (JP) ........................ 9-279013

(51) Int. Cl.
  *G09G 3/36* (2006.01)
  *H03M 1/68* (2006.01)
  *G09G 3/20* (2006.01)
  *H03M 1/76* (2006.01)
  *G09G 3/00* (2006.01)

(52) U.S. Cl.
  CPC ....... *H03M 1/682* (2013.01); *G09G 2310/0286* (2013.01); *G09G 2330/028* (2013.01); *G09G 3/3614* (2013.01); *G09G 2310/0294* (2013.01); *G09G 3/2011* (2013.01); *G09G 2310/027* (2013.01); *G09G 2320/0233* (2013.01); *G09G 3/3659* (2013.01); *G09G 3/3688* (2013.01); *H03M 1/765* (2013.01); *G09G 2300/0823* (2013.01); *G09G 2310/0297* (2013.01); *G09G 2320/041* (2013.01); *G09G 3/3648* (2013.01); *G09G 3/001* (2013.01); *G09G 2310/0248* (2013.01)
  USPC .............. 345/98; 345/99; 345/100; 345/204; 345/214

(58) Field of Classification Search
  USPC ............ 345/38, 50–52, 90–92, 98–100, 197, 345/206, 208, 204
  See application file for complete search history.

(56) References Cited

U.S. PATENT DOCUMENTS

4,716,403 A * 12/1987 Morozumi ...................... 345/88
(Continued)

FOREIGN PATENT DOCUMENTS

DE    4446330    7/1995
(Continued)

OTHER PUBLICATIONS

Office Action for the European Patent Office from counterpart application 97 308 260.5-2205, dated May 24, 2005.

*Primary Examiner* — Dwayne Bost
*Assistant Examiner* — Robert Michaud
(74) *Attorney, Agent, or Firm* — Fitzpatrick, Cella, Harper & Scinto

(57) ABSTRACT

A matrix substrate having plural switching elements provided in matrix corresponding to intersecting points of scanning lines and signal lines, plural picture element electrodes connected to the switching elements, and horizontal circuits and vertical circuits for inputting the signals to the switching elements comprises a horizontal scanning circuit for sampling a picture data based on digital picture signals, a latch circuit for memorizing the data synchronously with output from the horizontal scanning circuit, a D/A converter for converting the output from the latch circuit into analog signals, plural signal transfer switches provided between the D/A converter and the signal lines, and a selection circuit for selecting at least one of the signal transfer switches. A liquid crystal device comprises the matrix substrate, a counter substrate opposing to the matrix substrate and a liquid crystal material placed between the matrix substrate and the counter substrate.

8 Claims, 37 Drawing Sheets

(56) References Cited

U.S. PATENT DOCUMENTS

| | | | |
|---|---|---|---|
| 4,872,002 A * | 10/1989 | Stewart et al. | 345/55 |
| 4,963,860 A * | 10/1990 | Stewart | 345/206 |
| 4,985,698 A * | 1/1991 | Mano et al. | 345/103 |
| 5,021,774 A * | 6/1991 | Ohwada et al. | 345/90 |
| 5,091,722 A * | 2/1992 | Kitajima et al. | 345/89 |
| 5,170,158 A * | 12/1992 | Shinya | 345/98 |
| 5,250,931 A * | 10/1993 | Misawa et al. | 345/206 |
| 5,264,953 A * | 11/1993 | Hirai et al. | 349/33 |
| 5,317,433 A * | 5/1994 | Miyawaki et al. | 349/45 |
| 5,438,342 A * | 8/1995 | Yamaguchi | 345/58 |
| 5,467,215 A * | 11/1995 | Lebby et al. | 359/247 |
| 5,495,351 A * | 2/1996 | Shingaki et al. | 349/74 |
| 5,528,256 A * | 6/1996 | Erhart et al. | 345/96 |
| 5,530,266 A * | 6/1996 | Yonehara et al. | 257/72 |
| 5,576,730 A * | 11/1996 | Shimada et al. | 345/98 |
| 5,589,847 A * | 12/1996 | Lewis | 345/98 |
| 5,619,225 A * | 4/1997 | Hashimoto | 345/98 |
| 5,633,182 A * | 5/1997 | Miyawaki et al. | 438/30 |
| 5,644,329 A * | 7/1997 | Asari et al. | 345/89 |
| 5,648,792 A * | 7/1997 | Sato et al. | 345/92 |
| 5,657,040 A * | 8/1997 | Kanbara | 345/98 |
| 5,691,794 A * | 11/1997 | Hoshi et al. | 349/158 |
| 5,708,486 A * | 1/1998 | Miyawaki et al. | 349/44 |
| 5,784,042 A * | 7/1998 | Ono et al. | 345/94 |
| 5,784,072 A * | 7/1998 | Imamura et al. | 345/567 |
| 5,784,073 A * | 7/1998 | Yamazaki et al. | 345/537 |
| 5,798,746 A * | 8/1998 | Koyama | 345/98 |
| 5,818,406 A * | 10/1998 | Tsuchi et al. | 345/89 |
| 5,956,008 A * | 9/1999 | Kawasaki et al. | 345/93 |
| 6,369,788 B1 * | 4/2002 | Yamazaki et al. | 345/92 |

FOREIGN PATENT DOCUMENTS

| | | |
|---|---|---|
| EP | 0 391 655 A2 | 10/1990 |
| EP | 731440 | 9/1996 |
| JP | 2216190 | 8/1990 |
| JP | 4-52684 | 2/1992 |
| JP | 9073108 | 3/1997 |

* cited by examiner

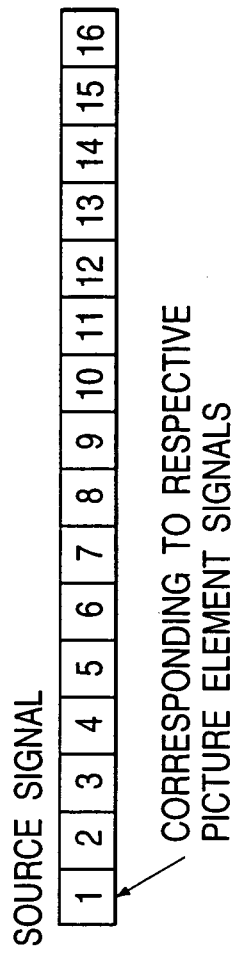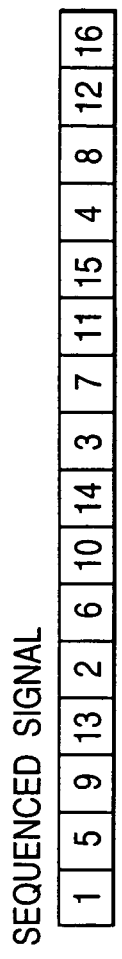
FIG. 2A
FIG. 2B

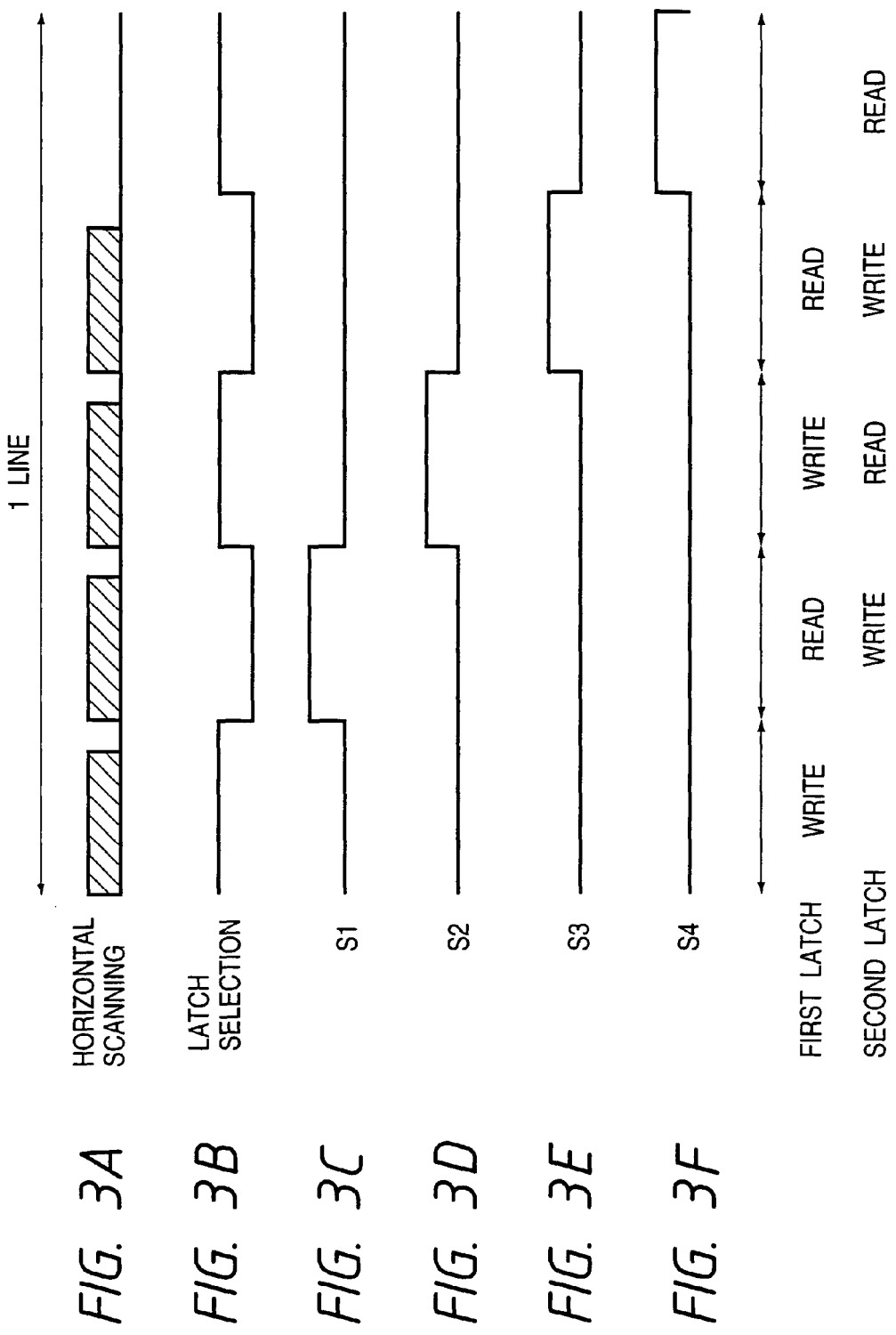

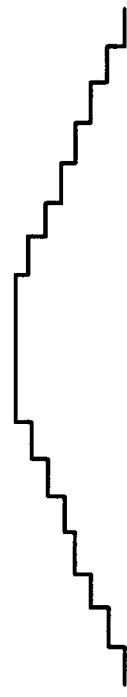
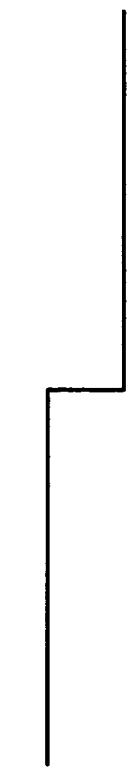
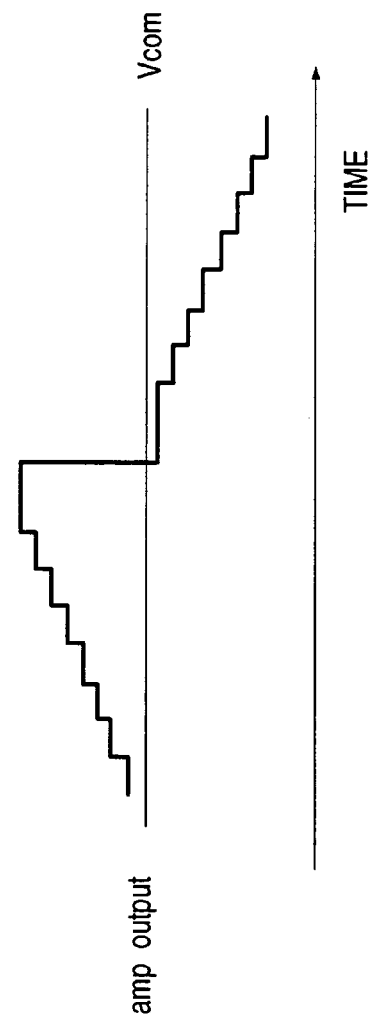
FIG. 20A
FIG. 20B
FIG. 20C
FIG. 20D

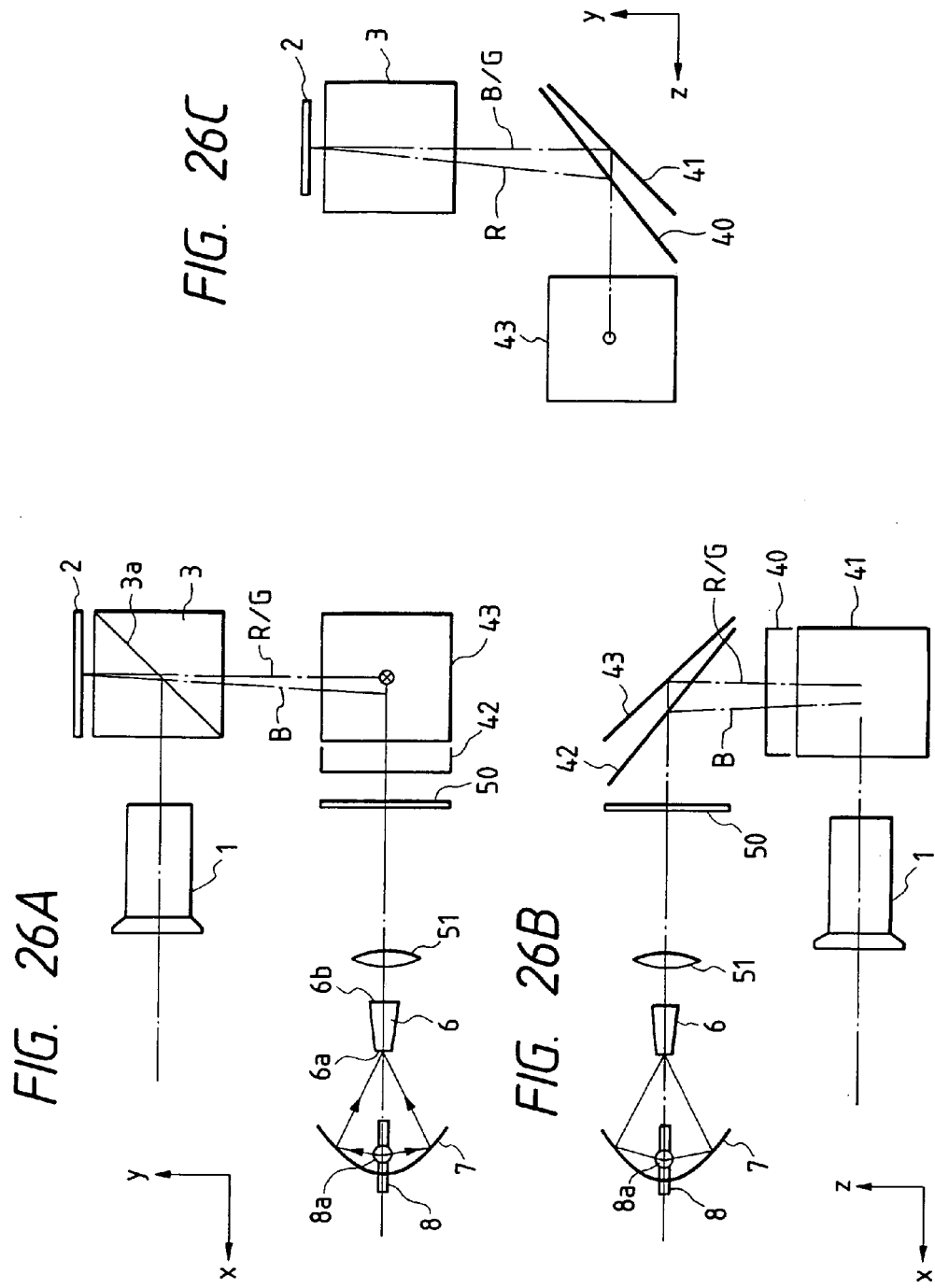

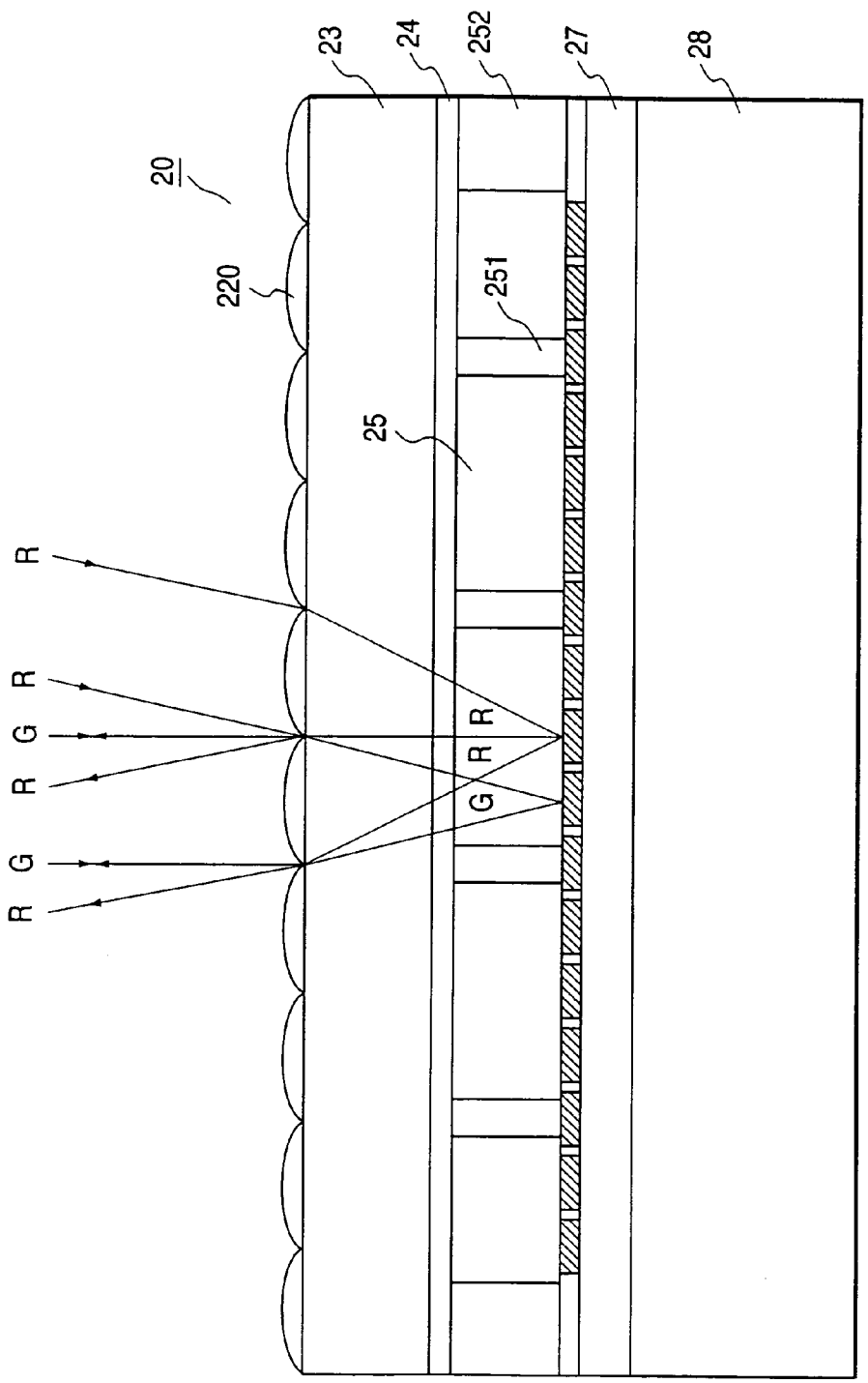

MATRIX SUBSTRATE AND DISPLAY WHICH INPUTS SIGNAL-POLARITY INVERTING SIGNALS TO PICTURE DATA

This application is a divisional of U.S. patent application Ser. No. 08/953,719, filed Oct. 17, 1997 (now abandoned), which is incorporated by reference herein in its entirety, as if fully set forth herein, and claims the benefit thereof under 35 U.S.C. §120, and further claims the benefit of priority under 35 U.S.C. §119, based on Japanese Priority Application No. 276531/1996 filed Oct. 18, 1996 and Japanese Priority Application No. 279013/1997 filed Oct. 13, 1997, which are incorporated by reference herein in their entirety, as if fully set forth herein.

BACKGROUND OF THE INVENTION

1. Field of the Invention

The present invention relates to a matrix substrate, a liquid crystal device employing the matrix substrate, and a display apparatus employing the liquid crystal device for displaying pictures and characters. More specifically, the present invention relates to a matrix substrate characterized by a means for supplying a video signal to a vertical signal lines of a horizontal-vertical scanning circuit for driving a liquid crystal device, a liquid crystal device employing the matrix substrate, and a display apparatus employing the liquid crystal device.

2. Related Background Art

In the present multimedia age, communication apparatuses using picture information are becoming more and more important. Of the communication apparatuses, liquid crystal display apparatuses are attracting attention because of the smaller thickness and the less power consumption, and the liquid crystal production is growing up to a basic industry comparable to the semiconductor industry. The liquid crystal displays are employed mainly to 10-inch note-sized personal computers at the moment. The liquid crystal displays are considered to be useful also for work station displays, home televisions, and other larger size display apparatuses. However, with the increase of the picture size, the display manufacture equipment becomes expensive, and display apparatus requires high levels of the electric properties for driving the larger picture display. With the increase of the picture size, the manufacture cost increases rapidly in proportion to 2-3th power of the picture size.

In recent years, to solve the above problems, a projection system is attracting attention in which a picture image formed by a small liquid crystal display panel is enlarged by optical projection. This system enables improvement of the characteristics and decrease of the production cost by size reduction similarly as the scaling law which teaches improvement of properties and cost by a finer semiconductor. The TFT type liquid crystal display panel requires small TFTs having sufficient driving force, and the TFTs are shifting from amorphous silicon type to polycrystalline silicon type. The picture signal of the resolution level of the NTSC Standard for usual television does not require so high speed treatment.

Therefore, not only TFT but peripheral driving circuit such as a shift register and a decoder is produced by use of polycrystalline silicon to provide a liquid crystal display apparatus having the display region and the peripheral circuit in integration. However, the polycrystalline silicon does not comes up with the monocrystalline silicon, and the shift register and other devices employing polycrystalline silicon have to be divided into portions to provide a high-quality television having a resolution level higher than NTSC Standard, or to realize a display of XGA (extended graphics array) level or SXGA (super-extended graphics array) level of computer resolution standard. Such division of the shift register or the like causes noises called a ghost in the display region corresponding the joint portions. This noise should be prevented.

On the other hand, the display apparatus employing a monocrystalline silicon substrate giving a remarkably high driving force is attracting attention in comparison with the polycrystalline display apparatus of an integration structure. This display apparatus employing the monocrystalline silicon substrate need not be divided as above since the transistors of the peripheral driving circuits have sufficient driving force, and have high S/N ratios at the joint portions of the display apparatus and the peripheral driving circuits without the noise and other disadvantages.

By use of either the polycrystalline silicon or the single crystalline silicon, a reflection type liquid crystal device can be provided by incorporation of a reflection type liquid crystal element prepared by connecting a TFT drain with a reflection electrode, and holding a liquid crystal between the reflection electrode and a light-transmissive common electrode.

The scanning circuit is also important which conducts displaying by writing video signals to respective picture elements of the reflection type liquid crystal element. An example thereof is explained by reference to FIG. 40. In FIG. 40, digital image signals are converted by signal processing circuit 230 (D/A conversion), and are inputted as analog signals to the chips of a liquid crystal device. Horizontal scanning circuit 231 inputs its control signals to the gate of transfer switch 234. In accordance with the control signal, the analog signals on common signal line 238 are led out sequentially to respective vertical signal lines 232. Vertical scanning circuit 950 outputs sequentially control signals to scanning lines 233. Scanning lines 233 are connected to gates of switch MOS transistor 235 in the liquid crystal picture elements. The sources thereof are connected to vertical signal lines 232. When switch MOS transistor 235 is turned on, the video signals at vertical signal line 232 apply electric field to liquid crystal 237 to keep a potential of additional capacity 236 to hold display.

The above described prior art technique has disadvantages below. Generally, the rate of writing is extremely high, so that the analog signals are formed as high frequency signals. Therefore, the transfer switch is required to conduct the transfer at an extremely high rate, which necessitates a larger size of the transfer switch. Furthermore, the wiring is necessary for connecting the above common signal lines to pads for connection to an external circuit, which results in a large capacitance of the common signal lines. In the liquid crystal display element, the amplitude of the analog picture signals is as high as 10 V or more, which requires a high performance of the external driving circuit for driving the load of high capacitance at a large amplitude at a high speed, and requires a high power consumption, disadvantageously. If a flexible cable or the like is used for connection to the external circuit, the reactance component is accompanied in proportion to the cable length, causing larger ringing of the signal with a larger load capacitance of the common signal lines. Therefore, the length of the cable is limited which reduces mechanical freedom disadvantageously.

Generally, with increase of number of display picture elements, driving speed of signal lines connected to transistors on an active matrix substrate has to increase. Japanese Patent Laid-Open Application No. 2-216190 (JPA02-216190) discloses a method of reducing the driving speed. This disclosed invention employs, as a signal line driving circuit element, a D/A converter which is constituted at least of a capacitor and a switch and receives signals of plural bits of gradation information, and inputs the plural bits of signals in series with time. This disclosure is explained by reference to FIG. 41.

In FIG. 41, the numeral 1030 denotes a liquid crystal panel employing a thin film transistor (not shown in the drawing) as a switching element. Thereto, signal line driving circuit 1040 and scanning line driving circuit 1050 are connected. Signal line driving circuit 1040 is constituted of shift register 1041, latch 1042, D/A converters 1043, and switches S1-Sn. In this display apparatus, the data of one-scanning electrodes are inputted to shift register 1041. The data are transferred to latch 1042 capable of holding data of 7-bit breadth, and held there. The data are then inputted to switched capacitor/series conversion type D/A converter group 1043. In D/A converters 1043, the data of the 7-bit breadth are inputted, bit by bit, successively and seven times of conversion is conducted to output analog signals. In this device, the D/A converter is employed for inputting digital signals. In the display device, the D/A conversion is reported to be conducted with high precision with a small circuit size since the D/A converter is constituted of a capacitor, a switch, and the like, and the D/A conversion is conducted by inputting bit data in series with time.

However, the liquid crystal devices for XGA, SXGA, or the like having a large number of display picture elements require the D/A converters corresponding to the number of the signal lines in the periphery of the display region of the liquid crystal for introducing the analog signals to the signal lines. This is not practical.

SUMMARY OF THE INVENTION

The object of the present invention is to provide an optimal signal processing, and a liquid crystal circuit to solve the above disadvantages of the liquid crystal driving circuit in consideration of the trend of picture signals toward digital signals in recent years.

According to an aspect of the present invention, there is provided a matrix substrate having plural switching elements provided in matrix corresponding to intersecting points of scanning lines and signal lines, plural picture element electrodes connected to the switching elements, and horizontal circuits and vertical circuits for inputting the signals to the switching elements, wherein the matrix substrate comprises a horizontal scanning circuit for sampling a picture data based on digital picture signals, a latch circuit for memorizing the data synchronously with output from the horizontal scanning circuit, a D/A converter for converting the output from the latch circuit into analog signals, plural signal transfer switches provided between the D/A converter and the signal lines, and a selection circuit for selecting at least one of the signal transfer switches.

In another aspect of the present invention, there is provided a liquid crystal device comprising a matrix substrate having plural switching elements provided in matrix corresponding to intersecting points of scanning lines and signal lines, plural picture element electrodes connected to the switching elements, and horizontal circuits and vertical circuits for inputting the signals to the switching elements; a counter substrate opposing to the matrix substrate; and a liquid crystal material placed between the matrix substrate and the counter substrate, wherein the matrix substrate comprises a horizontal scanning circuit for sampling a picture data based on digital picture signals, a latch circuit for memorizing the data synchronously with output from the horizontal scanning circuit, a D/A converter for converting the output from the latch circuit into analog signals, plural signal transfer switches connected to output of the D/A converter, and a selection circuit for selecting at least one of the signal transfer switches.

In the liquid crystal device of the present invention, the number and kinds of the constituting parts can be reduced in the external driving circuit, and the load to the picture signal lines can be reduced by employing digital input instead of analog input in conventional liquid crystal device. Further, the load to one D/A converter can be reduced and the time of writing into the liquid crystal picture element can be lengthened. Thereby, the entire power consumption of the liquid crystal can be reduced, the picture can be made finer, adverse influence of noises can be reduced, and picture quality can be improved.

BRIEF DESCRIPTION OF THE DRAWINGS

FIGS. 2A and 2B are schematic diagrams showing the operation of picture signal sequencing circuit for the liquid crystal panel of the present invention.

FIGS. 3A, 3B, 3C, 3D, 3E and 3F are timing charts showing operation of a driving circuit of a liquid crystal panel of the present invention.

(FIGS. 14A, 14B, 14C, 14D and 14E are skipped.)

FIGS. 20A, 20B, 20C and 20D are schematic diagrams showing output of a D/A converter.

FIGS. 26A, 26B and 26C are schematic diagrams of an example of a projection type display apparatus of the present invention.

FIG. 36 is a schematic diagram of an example of a liquid crystal panel of the present invention.

DESCRIPTION OF THE PREFERRED EMBODIMENT

First Embodiment

Figure 1:
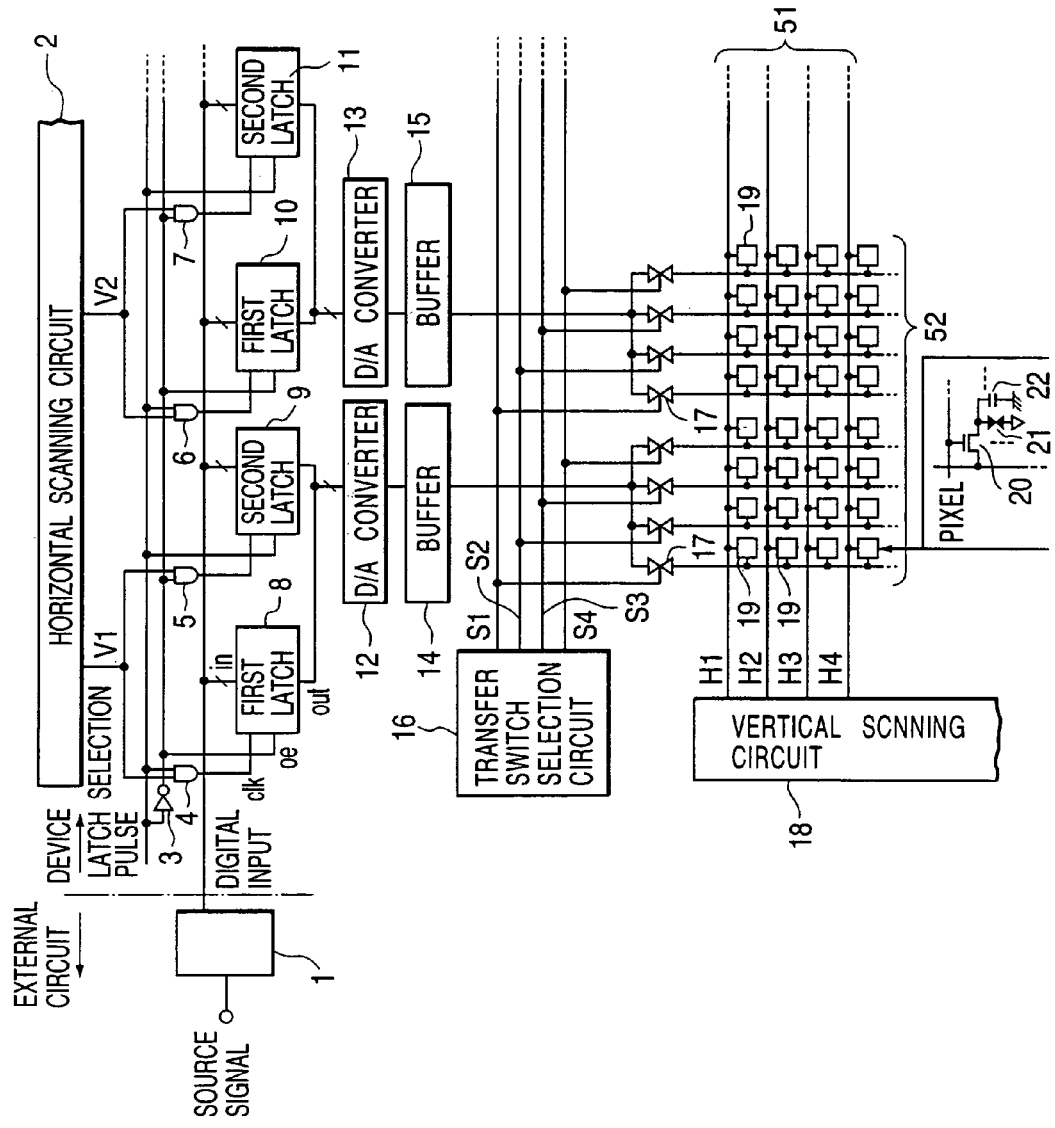
FIG. 1 is a circuit diagram of an example of driving circuit of a liquid crystal panel of the present invention.

FIG. 1 is an equivalent circuit diagram showing a first embodiment of the present invention. The device of this embodiment comprises plural vertical signal lines for the output from a horizontal scanning circuit, plural scanning lines for the output from vertical scanning circuit (shift register) 18, and picture element electrodes formed at the intersecting points of the vertical signal lines and the scanning lines with interposition of switches. Scanning lines 51 (H1-H4 ...) are connected to vertical scanning circuit 18 (shift register). Additionally there are provided horizontal scanning circuit (shift register) 2 for transferring picture signals to data latch circuits 8-11 ... for memorizing the picture signals synchronously with the output from the horizontal scanning circuit 2, and D/A converters 12, 13 for converting the output from the data latch circuit 8-11 into analog picture signals. The output from D/A converter 12, 13 is connected through output buffer circuit 14, 15 and signal-transfer switches 17 to the vertical signal lines 52. Output buffer circuits 14, 15 is not essential, and may be omitted. Transfer switches 17 are controlled by transfer switch selection circuit 16 constituted, for example, of shift registers. Transfer switch selection circuit 16 may also be constituted of a decoder circuit. The numeral 3 denotes an inverter, the numerals 4-7 denote AND circuits, and the numeral 19 denotes liquid crystal elements. The liquid crystal element 19 constitutes one picture element from switching MOS transistor 20, liquid crystal 21, and additional capacity 22.

In this embodiment, the number of D/A converters 12, 13 is less than the number of the picture elements arranged in the horizontal direction: the ratio of the numbers being 1/4 in this embodiment. The outputs from D/A converter 12, 13 is fed to respective liquid crystal elements 19 through buffers 14, 15 by turning on and off of four switches 17 under control by outputs S1-S4 of transfer SW selection circuit 16. Therefore the picture signals should be introduced for every fourth picture element. This circuit has sequencing means 1 as an external driving circuit for sequencing the picture signal data for the respective picture elements as shown in FIGS. 2A and 2B conceptionally. When the source signals corresponding to the respective picture elements are introduced as 1-16 in time series, the outputs from circuit 1 is sequentially arranged for every fourth element in the order as shown in FIG. 2B. FIGS. 2A and 2B illustrate a case that one D/A converter connected to four vertical signal lines, and 16 picture elements arranged in horizontal direction.

The number of D/A converters 12, 13 may be decided arbitrarily in consideration of a panel size, a circuit block area size, the upper limit of the driving frequency of D/A converters 12, 13, the power consumption, and so forth. In this embodiment, converters 12, 13 are respectively connected to two systems of data latch circuits 8-11, and one of the two latch circuits is selected by logic product of the latch selection pulse with output V1, V2 of horizontal scanning circuits 2 through inverter 3 and AND circuits 4-7.

The operation in this embodiment is explained by reference to the timing charts of FIGS. 3A to 3F. In FIGS. 3A to 3F, in the first horizontal scanning period, the latch selection pulse is adjusted to be high, thereby digital picture data being transferred to first data latch circuits 8, 10 successively and synchronously with the output of horizontal scanning circuit 2. In the subsequent horizontal scanning period, the latch selection pulse is adjusted to be low, thereby the data being transferred to second latch circuit 9, 11. Simultaneously, first data latch circuit 8, 10 comes to be in an output enable state, and the output of the first data latch circuit 8, 10 is inputted to D/A converters 12, 13 to convert the picture signals to analog signals. Then one of transfer switches 17 is turned on (S1 being high) by transfer selection means 16. The analog signals are transferred through buffer 14 to the vertical signal lines. As the results, the picture signals are transferred simultaneously into the liquid crystal picture elements of the same number as that of the D/A converters. Therefore, the operation speed of the D/A converter may be such that it responds within the same period as the one horizontal scanning. Thus the transfer time is long, so that the size of transfer switch 17 can be made smaller than that in conventional analog input system, and the load for the driving in analog system is much smaller because of the absence of the common signal line load in analog input systems.

In the third horizontal scanning period, the data are transferred to the first data latch circuit again, and simultaneously the data held in the second data latch circuit are written into the picture elements (S2 being high). The above scanning operation is repeated with one scanning line turned on to transfer picture signals into desired picture elements to form display for one line. The transfer is conducted for all the lines in the same manner to form display of one picture.

As is clear from the above description, two systems of the data latch circuits are provided in this invention to conduct the transfer of digital picture element data to the data latch and the transfer of analog picture data to the signal lines independently by the horizontal scanning circuit and the transfer switch selection circuit, so that the writing and reading-out of the data can be conducted simultaneously and the operation frequency of the D/A converter can be made lower. This is greatly advantageous for production of finer liquid crystal elements. Furthermore, the incorporation of the D/A converters into the elements makes feasible size reduction of the external driving circuit. Since the amplitude of the analog picture signals is as high as 10 V or more, the load for analog driving is desired to be lower in view of the power consumption. The load for analog driving in this invention is much lower than that for conventional analog input system, which enables reduction of the power consumption as a whole including the external driving circuit. In this invention, the transfer of the picture signals is conducted in a digital manner just before the D/A converters, keeping the signal quality irrespectively of decay of the signal, and improving picture quality without influence of noises.

Second Embodiment

Figure 4A:
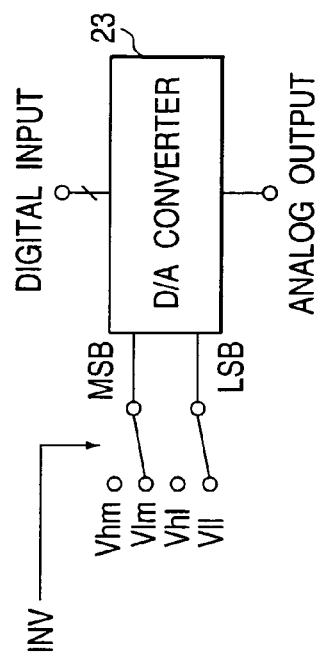
FIGS. 4A, 4B and 4C are diagrams showing a peripheral circuit and waveforms of a D/A converter of a liquid crystal panel of the present invention.
Figure 4B:
Figure 4C:
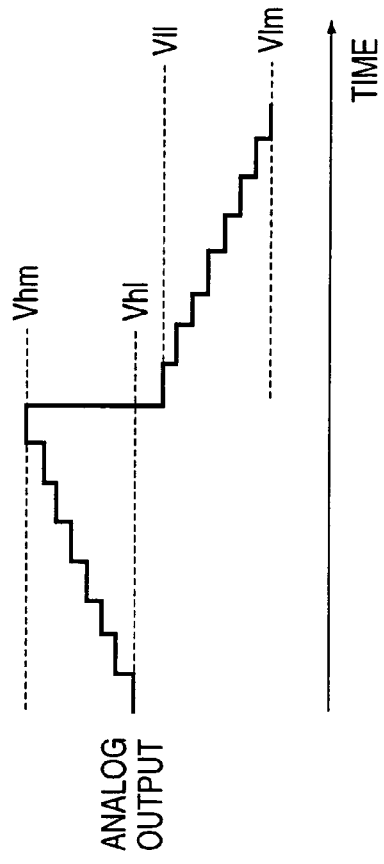

FIGS. 4A to 4C are equivalent circuit diagrams of a second embodiment of the present invention. The diagrams show only a portion of the D/A converter in the first embodiment. In the diagram, MSB denotes a reference voltage for the maximum analog output, and LSB denotes the reference voltage for the minimum analog output. INV denotes the signals for inverting the signal polarity, Vhm denotes the MSB for positive polarity, Vhl denotes the LSB for positive polarity, Vlm denotes the MSB for negative polarity, and Vll denotes the LSB for negative polarity. In liquid crystal display element, continuous long-time application of DC voltage can result in deterioration of the liquid crystal to cause sticking. To prevent the sticking, the picture signals are generally applied by AC driving in which the picture signals are inverted at a certain period. In this embodiment, the signal INV for inverting the signal polarity is applied to the liquid crystal display element separately from the digital picture signals to invert the polarity of the picture signals synchronously. The inversion of the signal polarity is conducted by changing the reference voltage in the D/A converter.

The operation in this embodiment is explained below. In the period of positive signal writing, the reference voltages of the D/A converter is controlled to keep INV to be high to obtain MSB to be Vhm and LSB to be Vhl, and the D/A converter can output in the dynamic range between Vhm and Vhl as shown in FIGS. 4A to 4C. In the period of negative signal writing, the reference voltages of the D/A converter is controlled to keep INV to be low to obtain MSB to be Vlm and LSB to be Vll, and the D/A converter can output in the dynamic range between Vlm and Vll as shown in FIGS. 4A to 4C. Thus the polarity inversion of the picture signals can be practiced.

Third Embodiment

Figures 5A, 5B, 5C:
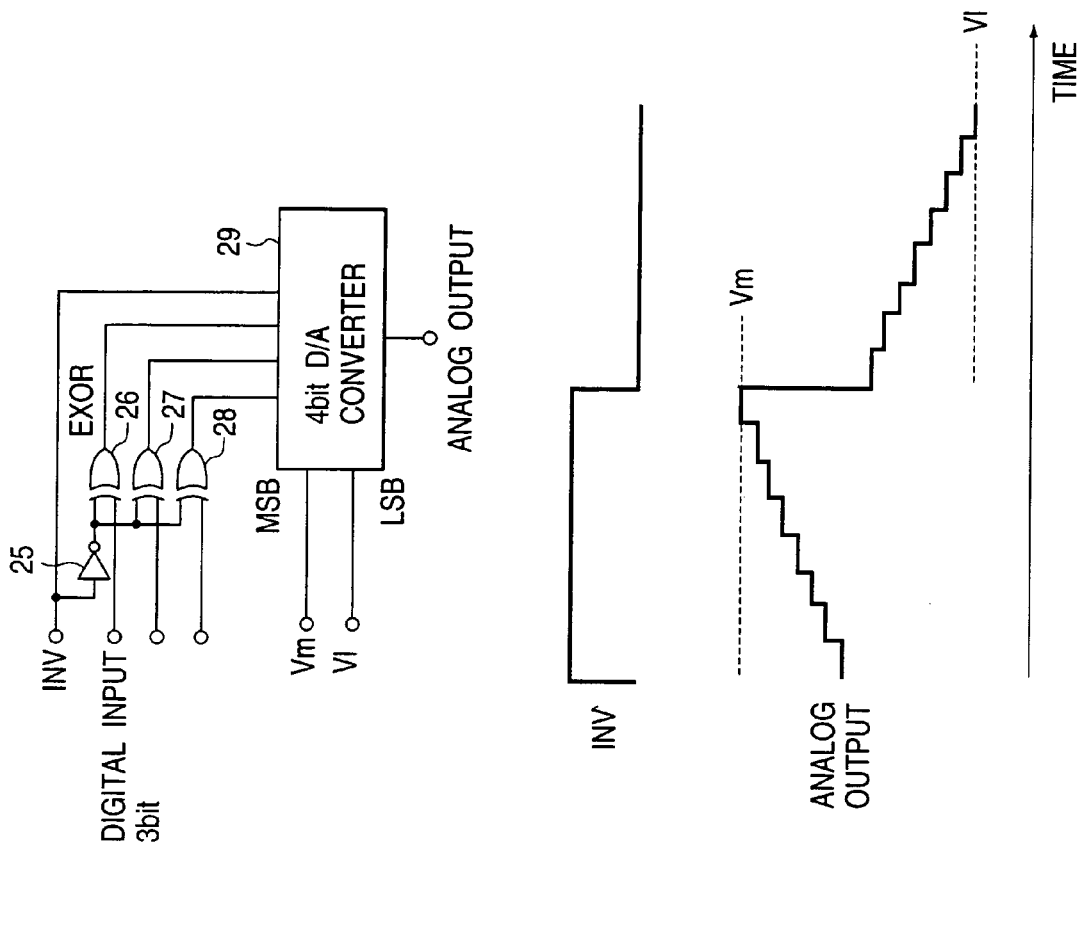
FIGS. 5A, 5B and 5C are diagrams showing a peripheral circuit and waveforms of a D/A converter of another liquid crystal panel of the present invention.

FIGS. 5A to 5C show equivalent circuit diagrams of a third embodiment of the present invention. The diagrams show only the D/A converter portion of First Embodiment. In this Third embodiment, the polarity inversion is conducted by employing D/A converters of one bit more than the number of the picture signal bits. This embodiment includes EX-OR (exclusive logical sum) circuit for inverting the polarity of the digital signals by application of INV signal. In FIGS. 5A to 5C, the picture signals are generated in three bits, and the D/A converters operate in four bits. Of the digital inputs to the D/A converter, the polarity inversion pulse INV is applied to the most significant bit, and the inversion output of INV is introduced together with the three bits of picture signals to the EX-OR circuit, and the output is introduced to the less significant bit stage of the D/A converter. The maximum Vm and the minimum Vl are also applied.

The operation in this embodiment is explained below. At the high level of INV, the D/A converter operates in the dynamic range of from Vm to (Vm+Vl)/2, and at the low level of INV, the D/A converter operates in the dynamic range of from (Vm+Vl)/2 to Vl as shown in FIG. 5C. The voltage applied to the liquid crystal is equal to the difference between the picture electrode potential and the common electrode potential (center potential). When the INV is at the low level, the picture signals should be logically inverted. Therefor the EX-OR circuit for the INV pulse is provided. The polarity inversion of the picture signals is realized as above.

Fourth Embodiment

A liquid crystal display apparatus employing a liquid crystal panel having the aforementioned liquid crystal driving circuit is explained below in detail by reference to drawings without limiting the invention. Naturally, the effect can be augmented by combination of the techniques for the embodiments. The structure of the liquid panel is described which has a semiconductor substrate. However, the substrate is not limited to a semiconductor substrate. The structure described above may be formed on a usual light-transmissive substrate. The liquid crystal panels described below comprises MOSFET or TFT as the picture element switch. However, the picture element switch may be of a diode type or a two-terminal type. The liquid crystal panels described below are useful for display apparatus of household televisions, projectors, head-mounting displays, stereoscopic picture game machines, lap-top computers, electronic pocketbook, TV conference systems, car navigation systems, aeroplane meter panel, and the like.

Figure 6:
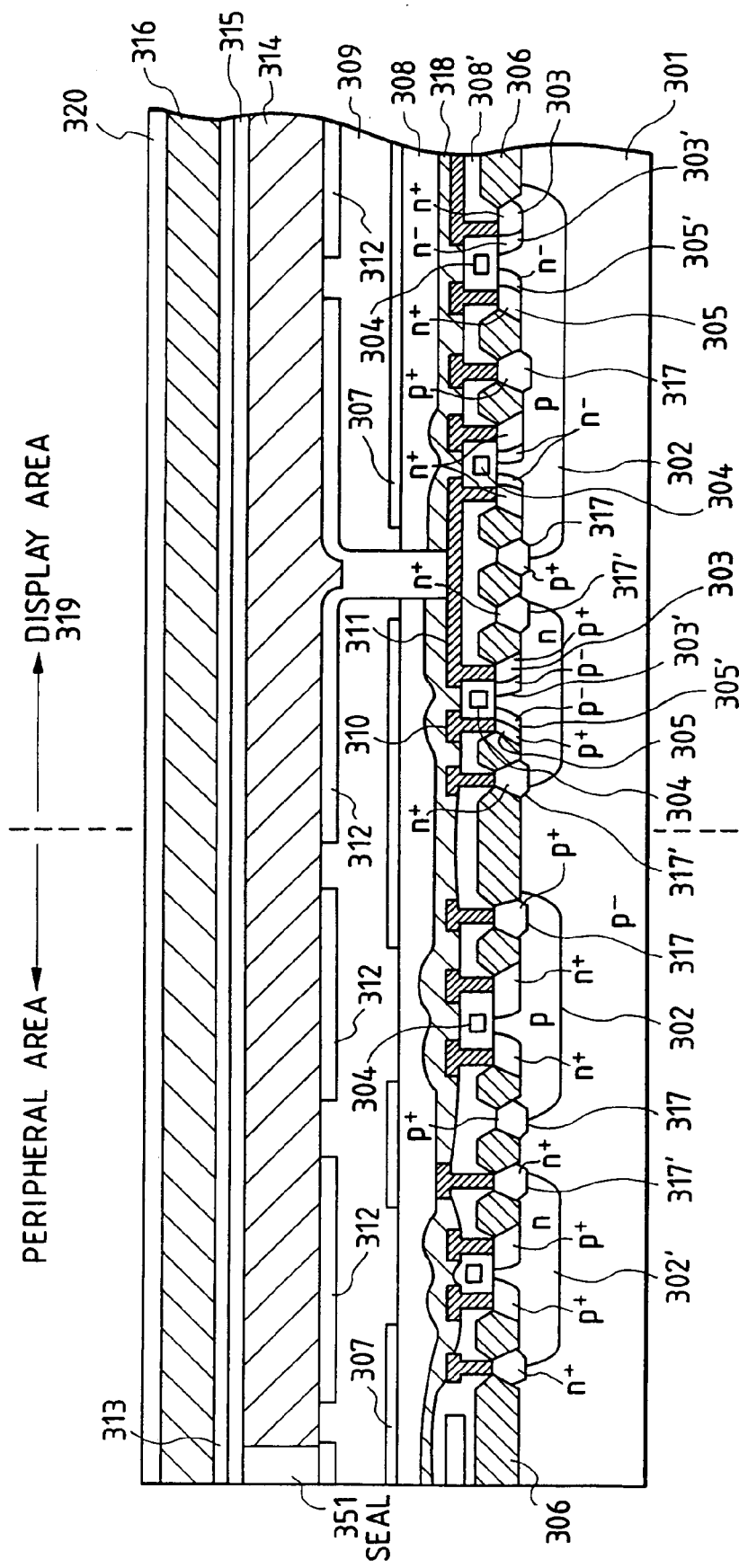
FIG. 6 is a sectional view of a liquid crystal device of the present invention.

FIG. 6 is a sectional view of a liquid crystal panel of this embodiment. In FIG. 6, the numeral 301 denotes a semiconductor substrate; 302 and 302', a p-type well and an n-type well, respectively; 303, 303', and 303'', transistor source regions; 304, gate regions; and 305, 305', and 305'', drain regions.

As shown in FIG. 6, a high voltage of 20-35 V is applied to the transistor of the display region, and the source and the drain layers are not self-matchingly formed. Therefore, offsets are provided, and therebetween, a low-concentration $n^-$-layer in a p-well and a low-concentration $p^-$-layer in an n-well are provided in source region 303' and drain region 305'. The offset ranges preferably from 0.5 to 2.0 μm. The left portion of FIG. 6 shows a part of the peripheral circuit. At a part of the circuit at the periphery, the source layers and the drain layers are formed by self-matching to the gates.

The offsets of the sources and the drains are described above. The amount of the offset is set depending on the dielectric strengths. The length of the gate is optimized effectively. A part of the peripheral circuit is a logic circuit, and can be driven by a voltage of 1.5-5 V. Therefore, the above self-matching structure is employed for reduction of the transistor size and for improving the transistor driving power. The substrate 1 is made of a p-type semiconductor. The substrate is kept at the lowest potential (usually at the ground potential). To the n-type well, a picture element voltage of 20-35 V is applied in the display region. To the logic circuit portion of the peripheral circuit, a logic driving voltage of 1.5-5V is applied. With this structure, an optimized device is constructed corresponding to respective voltages, and thereby the chip size can be decreased, and picture element display can be conducted with high quality at a high speed.

In FIG. 6, the numeral 306 denotes a field oxide film; 310, a source electrode connected to data wiring; 311, a drain electrode connected to a picture electrode; 312, a picture element electrode serving also as a reflection mirror; and 307, a light-intercepting layer covering the display areas, and peripheral region preferably formed from Ti, TiN, W, Mo, or the like. The display region is covered with the light-intercepting layer 307 except for the connection portions of picture element electrode 312 and the drain electrode 311. The peripheral picture element region is covered with the light-intercepting layer 307 except for regions of larger wiring capacitance like a part of the video line and the clock line, and when high-speed signal causes malfunction of the circuit by introduction of stray light to the portion not covered with light-intercepting layer 307, the layer of the picture element electrodes is covered. Insulating layer 308 is placed under light-intercepting layer 307. Insulating layer 308 is stabilized by flattening the underlying P—SiO layer 318 by SOG and covering it with P—SiO layer 308. Instead of the SOG treatment, the flattening may be conducted by forming a P-TEOS (phospho-tetraethoxysilane) film, covering it with P—SiO layer 318, and treating insulating layer 308 by CMP.

The numeral 309 denotes an insulating layer provided between reflective electrode 312 and light-intercepting layer 307. Reflective electrode 312 has charge-holding capacity by aid of this insulation layer 309. For a larger capacity, the insulation layer is effectively made from highly dielectric P—SiN, $Ta_2O_5$, or a lamination film with $SiO_2$, in place of simple $SiO_2$. The light-interception layer is preferably formed on a flat face of a metal such as Ti, TiN, Mo, and W in a layer thickness ranging from about 500 to 5000 Å.

The numeral 314 denotes a liquid crystal material; 315, a common light-transmissive electrode; 316, a counter substrate; 317 and 317', high-impurity concentration regions; and 319, a display region; 320, an anti-reflection film.

As shown in FIG. 6, high-impurity concentration layers 317, 317' having the same polarity as the wells 302, 302' are formed at the periphery and the interior of the wells 302, 302', and the well potential is fixed stably at a desired potential by the low-resistance layer even when signals of high amplitude is applied to the source, thereby realizing high-quality picture display. Between n-type well 302' and p-type well 302, the aforementioned high-impurity concentration layers 317, 317' are provided with interposition of a field oxide film, which makes unnecessary the channel-stop layer usually provided for MOS transistors. These high-impurity concentration layers 317, 317' can be produced simultaneously with formation of the source layer and the drain layer in the same process, so that the number of kinds of masks and the number of the production steps are decreased to lower the production cost.

The numeral 313 denotes an anti-reflection layer provided between a common light-transmissive electrode 315 and counter substrate 316, and is designed to reduce interfacial reflection in consideration of the refraction index of the liquid crystal at the interface. The insulation film has preferably a refraction index lower than the refraction indexes of counter substrate 316 and light-transmissive electrode 315.

Figure 7:
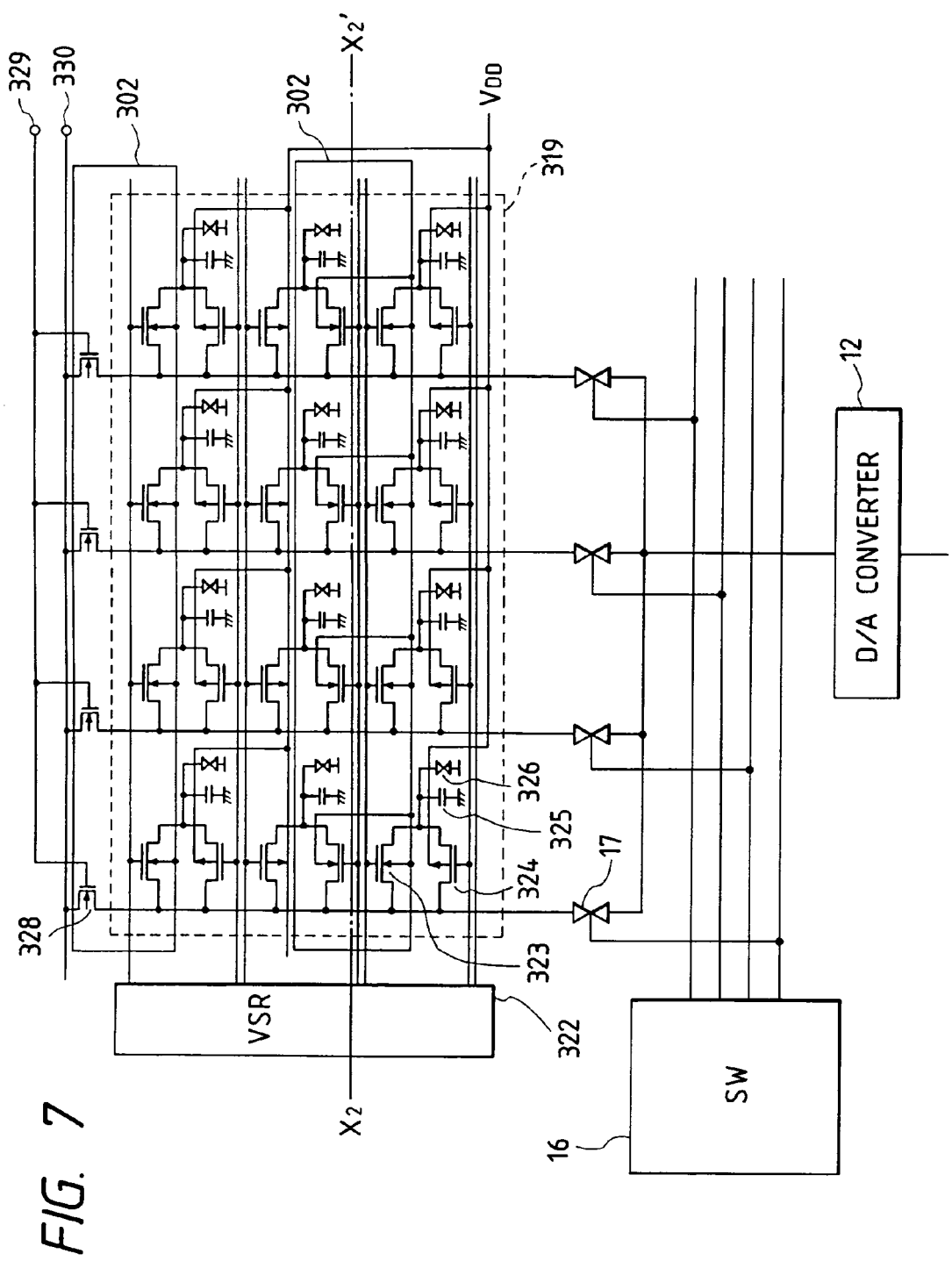
FIG. 7 is a schematic circuit diagram of an example of a liquid crystal device of the present invention.

FIG. 7 is a circuit diagram of this embodiment. In FIG. 7, the horizontal scanning circuit for introducing signals to the vertical signal lines is similar to the one shown in FIG. 1, but is different in that the analog signals outputted from converter 12 are introduced to switches 17 without passing the buffer circuit. Otherwise, the circuit is the same as the one shown in FIG. 1. Therefore, FIG. 7 shows only D/A converter 12, transfer switch selection circuit 16, and signal transfer switches 17.

In FIG. 7, the numeral 322 denotes a vertical shift register (VSR); 323, an n-channel MOSFET; 324, a p-channel MOSFET; 325, a retention capacity; 326, a liquid crystal layer; 328, a reset switch; 329, a reset pulse input terminal; 330, a reset power source terminal; and 319, a display region. Semiconductor substrate 301 may be of an n-type, although it is of p-type in FIG. 6.

As shown in FIG. 6, well region 302' is of a conductive type opposite to semiconductor substrate 301. Therefor, well region 302 is of p-type. p-Type well region 302 and n-type well region 302' contains preferably an impurity implanted at a concentration higher than that of semiconductor substrate 301: for the impurity concentration of semiconductor substrate ranging from $10^{14}$ to $10^{15}$ ($cm^{-3}$), the impurity concentration in well region 302 preferably ranges from $10^{15}$ to $10^{17}$ ($cm^{-3}$).

Source electrode 310 is connected to a data wiring for transferring display signal, and drain electrode 311 is connected to picture electrode 312. These electrodes 310, 311 are formed usually from the material Al, AlSi, AlSiCu, AlGeCu, or AlCu. The contact can be stabilized and contact resistance can be reduced by providing a bia metal layer composed of Ti and TiN on the contact interface between the bottoms of electrodes 310, 311 and the semiconductor. The picture element electrode has preferably a flat surface and is highly reflective. The material includes Cr, Au, Ag, and the like in addition to usual wiring metals of Al, AlSi, AlSiCu, AlGeCu, and AlC. For improvement of flatness, the surfaces of underlying insulation layer 309 and picture element electrode 312 are treated for chemical mechanical polishing (CMP).

The retention capacity 325 serves to retain signals between picture element electrode 312 and common light-transmissive electrode 315. To well region 302, the substrate potential is applied. In this embodiment, the transfer gates of the respective lines are constituted such that the ones of the first line from the top have n-channel MOSFET 323 at the upper side and p-channel MOSFET 324 at the lower side, and the ones of the second line from the top have p-channel MOSFET 323 at the upper side and n-channel MOSFET 324 at the lower side, the arrangement being changed alternately. As described above, the stripe type well contacts with power source line at the periphery of the display region, and further fine power source line is provided in the display region for the contact.

The most important point is the stabilization of the resistance of the well. Therefore, with a p-type substrate, the contact area or the number of the contact points in an n-well is made larger than that in the p-well in the display region. The p-well is kept at a prescribed potential by the p-type substrate, and the substrate serves as a low resistance article. Therefore, it is liable to be affected greatly by input or output of signals to or from the source and the drain of the n-well in an island state. The influence can be prevented by strengthening the contact with the upper wiring layer.

The picture signals are fed to the vertical signal lines in the same manner as shown in FIG. 1. Vertical shift register 322 applies high pulse to the gate of n-channel MOSFET 323, and low pulse to the gate of p-channel MOSFET on the selected line.

As described above, the switch in the picture element portion is constituted of monocrystalline CMOS transmission gate, and the signals from the source can be written in fully to the picture electrode, independently of the threshold value of the MOSFET, advantageously.

The switch is constructed from a monocrystalline transistor, and realizes high speed driving with high reliability without variation and without instable behavior in the crystal grain interface of polysilicon-TFT.

Figure 8:
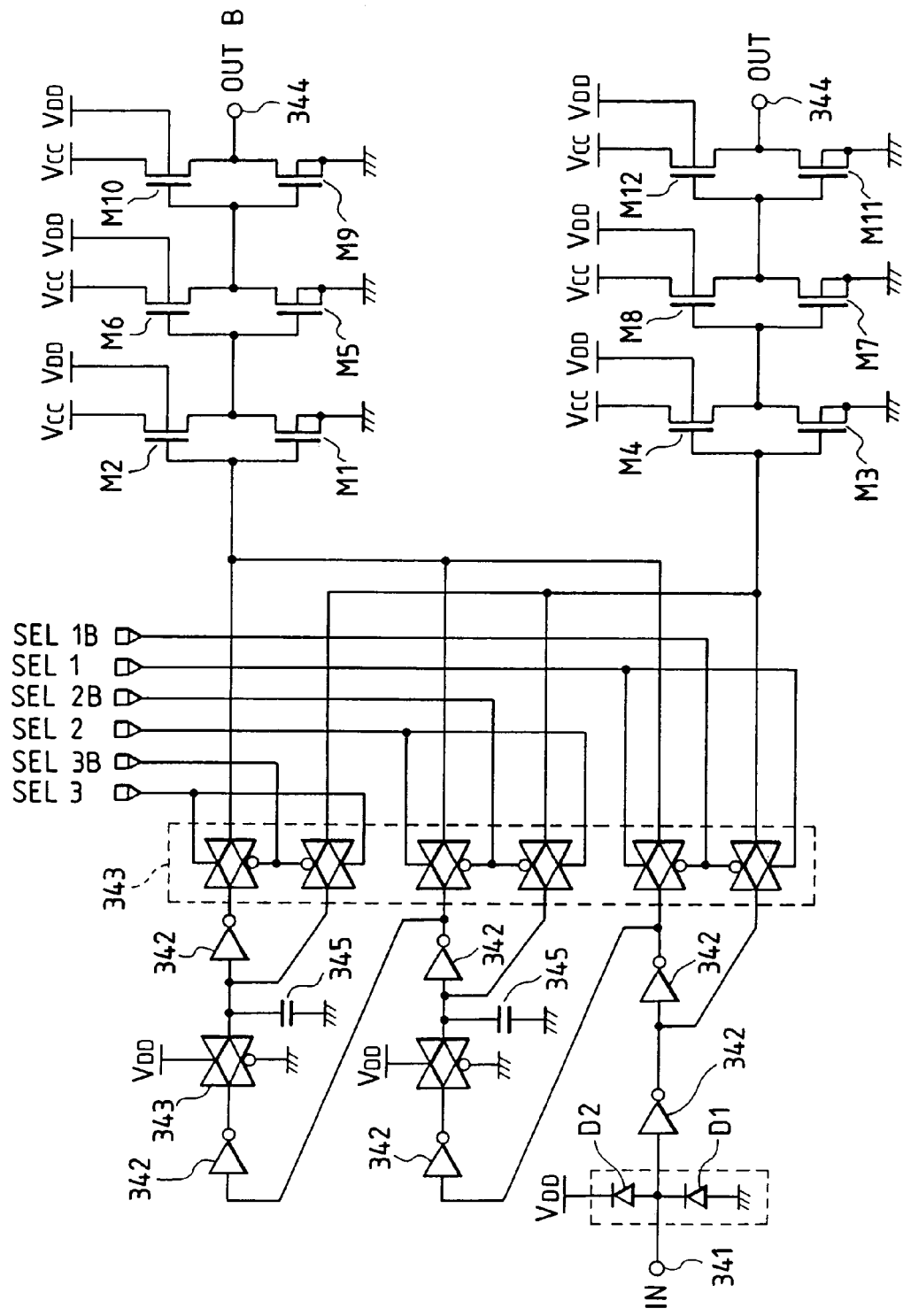
FIG. 8 is a circuit diagram including a delay circuit of input portion of a liquid crystal device of the present invention.

Next, the method for synchronizing video signals precisely with the sampling pulse is explained by reference to FIG. 8. For the synchronization, the quantity of the delay of sampling pulse should be changed. In FIG. 8, the numeral 342 denotes an inverter for delaying the pulse; 343, a switch for selecting the inverter for delaying; 344, output with the controlled delay; 345, a capacity ("out B" being reverse phase output, and "out" being in-phase output); and 346, a protection circuit.

The number of the inverters 342 to be passed for the delay is selected by combination of from SEL1 (SEL1B) to SEL3 (SEL3B).

The synchronization circuit in the panel adjusts, by use of the above selection switch, any disturbance of the symmetry of the quantity of delay of pulse from outside of the panel of R, G, and B caused by jigs or the like to give excellent picture display without positional deviation at the high phase region of R, G, and B. Further, a temperature measurement diode may be incorporated in the panel to correct the temperature of the delay by reference to the table.

The liquid crystal material is explained below. In FIG. 6, the device has a flat counter substrate structure. Common electrode substrate 316 has a rough surface to prevent the interfacial reflection by common light-transmissive electrode 315, and common light-transmissive electrode 315 is provided on the rough surface. On the reverse side of common electrode substrate 316, anti-reflection film 320 is provided. The roughening of the surface may be conducted by polishing with fine abrasive grains, and is effective for increase of the contrast.

The liquid crystal material is polymer-network liquid crystal PNLC. Instead, PDLC may be used. The polymer-network liquid crystal PNLC can be prepared according to a phase separation polymerization method. In this method, a liquid crystal material, and a polymerizable monomer or oligomer are dissolved in a solvent, the solution is introduced into a cell, polymerization is caused by UV to separate the polymer phase from the liquid crystal phase to form a polymer network in the liquid crystal. The PNLC contains the liquid crystal at a higher content (70-90% by weight).

In use of PNLC, a nematic liquid crystal having a high anisotropy ($\Delta n$) of the refractive index does not give strong light scattering, while a nematic liquid crystal having a high anisotropy ($\Delta \in$) of the dielectric constant enables driving at a low voltage. The light scattering for achieving high contrast can be obtained with a network of center-to-center distance of 1-1.5 μm.

Figure 9:
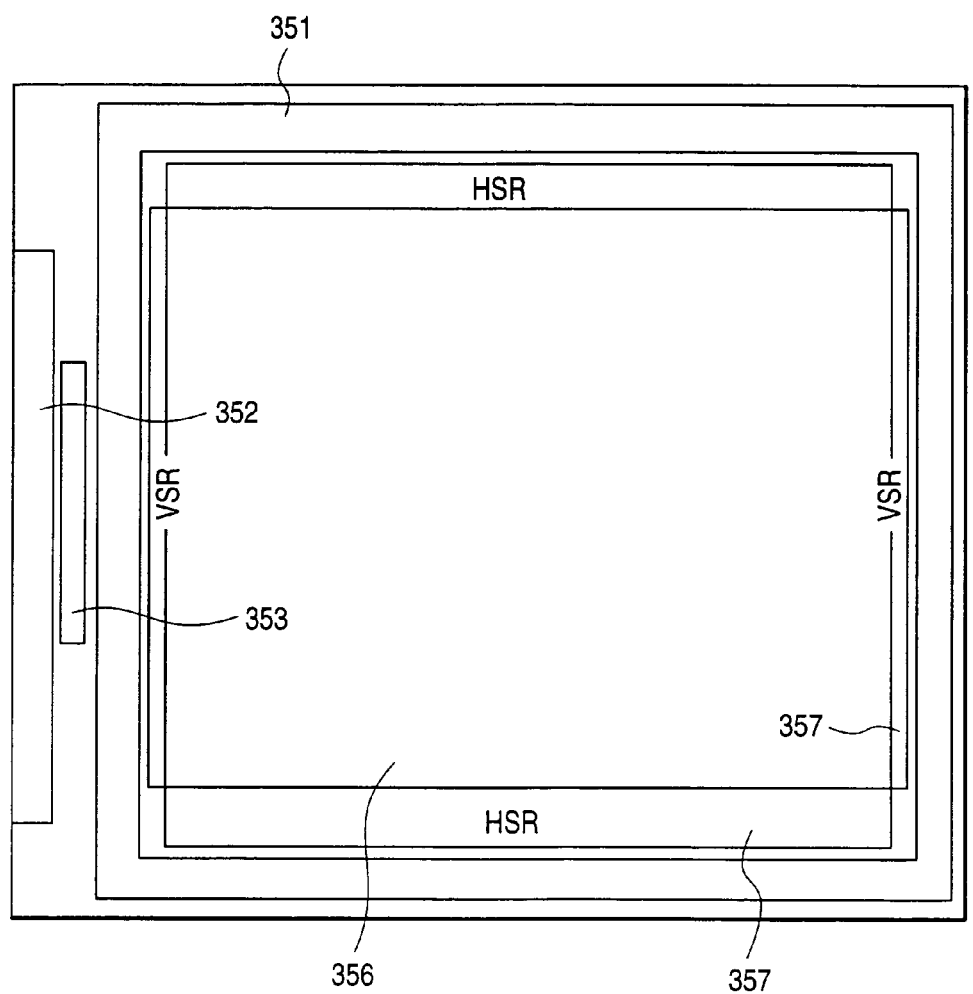
FIG. 9 is a schematic diagram of a liquid crystal panel of the present invention.

The seal structure and the panel structure is explained below by reference to FIG. 9. In FIG. 9, the numeral 351 denotes a seal portion; 352, an electrode pad; and 353, a clock buffer circuit. The panel has an amplifier not shown in the drawing. This amplifier is used in the electric inspection of the panel as an output amplifier. The panel has an Ag paste portion not shown in the drawing for application of the potential of the counter substrate. The numeral 356 denotes a display portion employing the liquid crystal elements. The numeral 357 denotes peripheral circuit portion including a horizontal-vertical shift register (SR). The seal portion 351 is provided at the periphery of display portion 356, and there semiconductor substrate 301 having picture image electrode 312 and a glass substrate having common electrode 315 are bonded by application of a contact bonding agent or an adhesive. After the bonding at seal portion 351, the liquid crystal is enclosed and sealed in display portion 356 and shift register portion 357.

In this embodiment as shown in FIG. 9, the circuits are provided inside and outside the seal so that the total chip size is made smaller. In this panel, the leading pads are gathered to one side of the panel. However, the leading-out may be conducted at the both long sides or any plural sides for handling of a high-speed clock.

In this embodiment, a semiconductor substrate such as an Si substrate is employed. This substrate can cause malfunction by variation of the substrate potential if the panel is exposed to strong light like a projector light and the light is introduced to the side wall of the substrate. Therefore, the side walls of the panel, and the peripheral circuit portion of the display region on the upper face of the panel are made to serve as a light-intercepting substrate holder. The back face of the Si substrate is connected to highly thermoconductive metal like Cu with interposition of a highly thermoconductive adhesive.

The structure of the aforementioned reflective electrode and a method for its preparation are described below. The completely flattened reflective electrode structure is prepared by forming preliminarily grooves by etching on the position of electrode pattern, forming a metal film thereon, removing the metal by polishing except for the electrode pattern portion, and simultaneously flattening the metal by polishing on the electrode pattern. This method is different from the conventional method in which a metal is patterned and later it is polished. Yet the width of the wiring is much larger than that of the non-wiring region. The structure of this embodiment cannot be prepared by a conventional etching method because of the problems below.

Figure 10A:
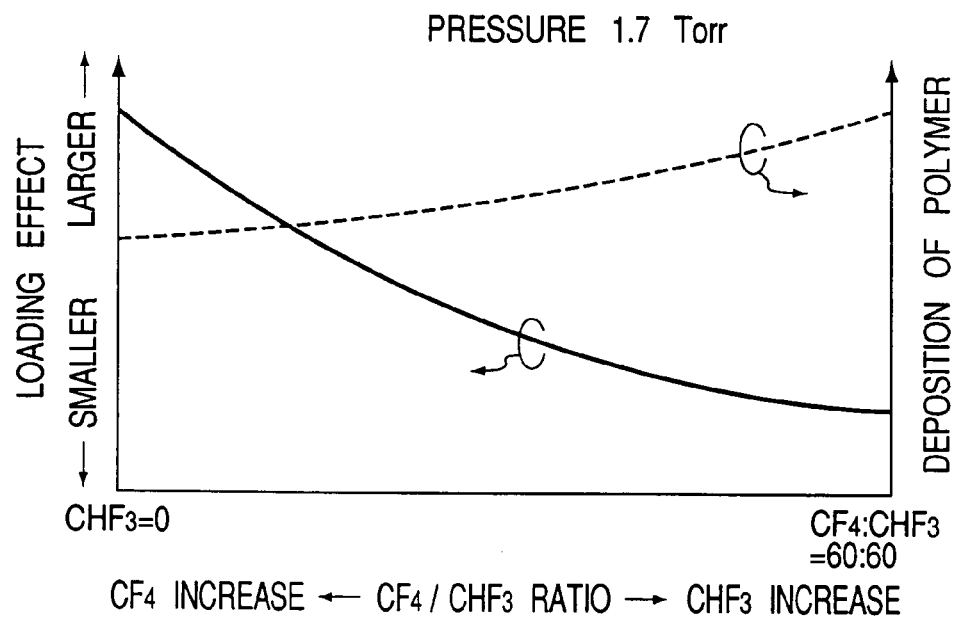
FIGS. 10A and 10B are graphs for judging the result of the etching treatment in production process of a liquid crystal device of the present invention.
Figure 10B:
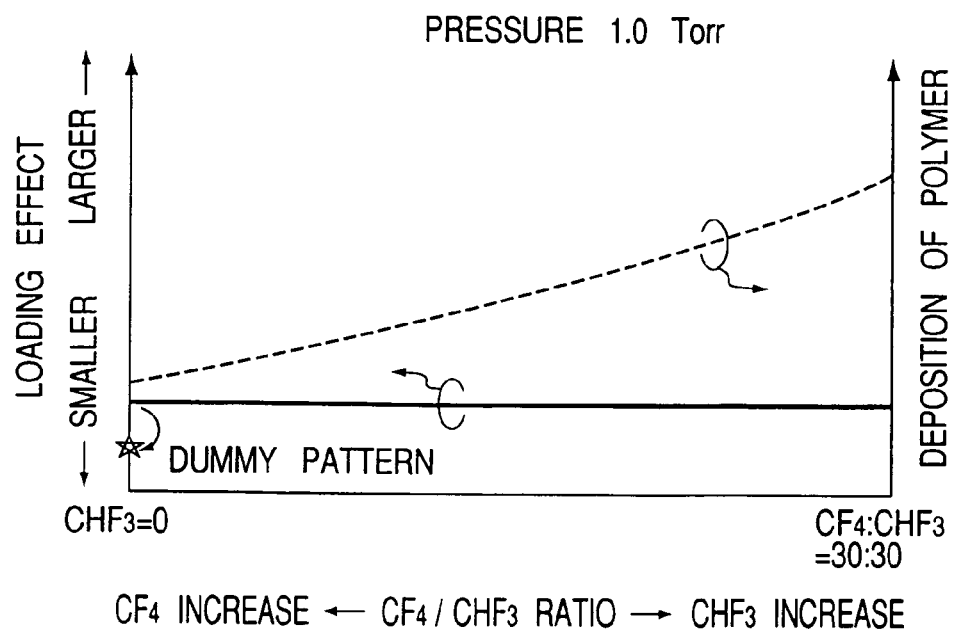

In the conventional method, polymer deposits during the etching to prevent patterning. The polymer is considered to be formed from the sputtered resist, etching material, or gas itself. Therefore, the etching conditions were changed in the oxide film etching ($CF_4$/$CHF_3$ system). FIGS. 10A to 10B shows the results. FIG. 10A shows the result of etching at a total pressure of 1.7 torr, and FIG. 10B shows the results at a total pressure of 1.0 torr. Under the conditions of FIG. 10A, the polymer deposition decreases obviously with decrease of the deposit-forming $CHF_3$ gas, but the difference between the pattern dimension near the resist and the pattern remote from the resist (loading effect) becomes significant, therefore being not practicable.

After many experiments, the inventors of the present invention found that at the pressure of 1 torr or lower, the loading effect can be mitigated significantly, and that etching by $CF_4$ only without using the deposit-forming $CHF_3$ gas is effective.

Further, little amount of the resist exists in the picture element electrode region, while the peripheral portions are occupied by the resist. Such a structure is difficult to form. It was found that formation of dummy electrodes is effective in the surrounding region and in the periphery of the display region.

Such a structure gives the effects that the level difference along the border between the display portion and the surrounding portion or seal portion can be removed, the gap precision is improved, the uniformity in the plane is improved, the irregularity of the liquid crystal injection is decreased, and a high-quality picture device can be produced at a high yield.

Figure 11:
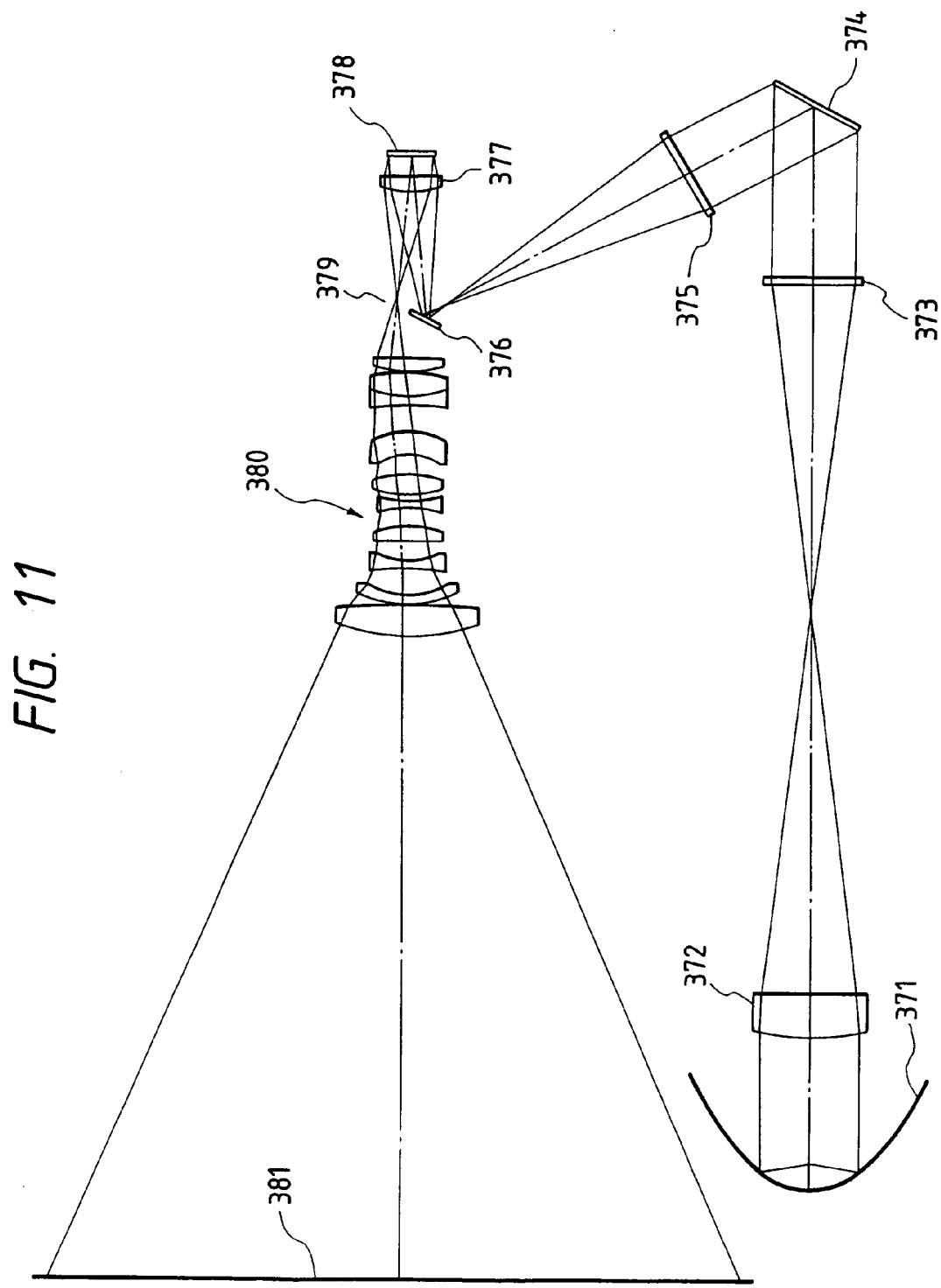
FIG. 11 illustrates schematically a liquid crystal projector employing a liquid crystal device of the present invention.

The optical system incorporating the reflective type liquid crystal panel of this embodiment is explained by reference to FIG. 11. In FIG. 11, the numeral 371 denotes a light source such as a halogen lamp; 372, a condenser lens for focusing the light source image; 373 and 375 are respectively a planar convex Fresnel lens; 374, a color separating optical element for separating the light into R, G, and B such as dichroic mirror, and diffraction grating; 376, a mirror for introducing the separated light of R, G, and B respectively to three panels of R, G, and B; 377, a field lens for introducing the condensed beam as parallel ray to the reflective liquid crystal panel; 378, the aforementioned reflection type liquid crystal element; 379, the position of a diaphragm; 380, a projection lens system for projecting an enlarged picture; and 381, a screen. Clear bright picture image can be obtained at high contrast by use of a two-lens combination of a Fresnel lens for converting the projected light into parallel light, and a lenticule for displaying in a wide up-down and right-left angle. In FIG. 11, a one-color panel only is shown. However, the light is separated into three colors between color-separation optical element 374 to diaphragm portion 379, and three panels are employed. Otherwise, naturally, a single panel constitution can be employed by providing a microlens array on the surface of a panel of a reflection type liquid crystal to introduce different incident light to different picture element region. The light reflected regularly at the respective picture elements on application of a voltage to the liquid crystal layer is projected through diaphragm portion 379 onto the screen.

On the other hand, when the liquid crystal layer is in a irregular state in the absence of the voltage application, the light introduced to the reflection type liquid crystal element is scattered in every direction, and only the scattered light directed to the aperture of the diaphragm portion 379 is introduced to the projection lens to display a black color. Thus the above optical system does not require a polarization plate, and signal light from all the picture element electrode is introduced to the projection lens at a high reflection ratio. Therefore, the display can be obtained at a brightness higher than conventional ones by a factor of 2 to 3. As described for the above embodiment, the surface of the counter substrate, and the interface are treated for anti-reflection, and noise light component is extremely less, thereby high contrast display can be realized. Further, since the panel size can be made smaller, all the optical elements (lenses, mirrors, etc.) can be miniaturized to lower the production cost and to decrease the product weight.

The irregularity in color and brightness of the light source can be offset on the screen by inserting an integrator (fly-eye lens type, or rod type) between the light source and the optical system.

Figure 12:
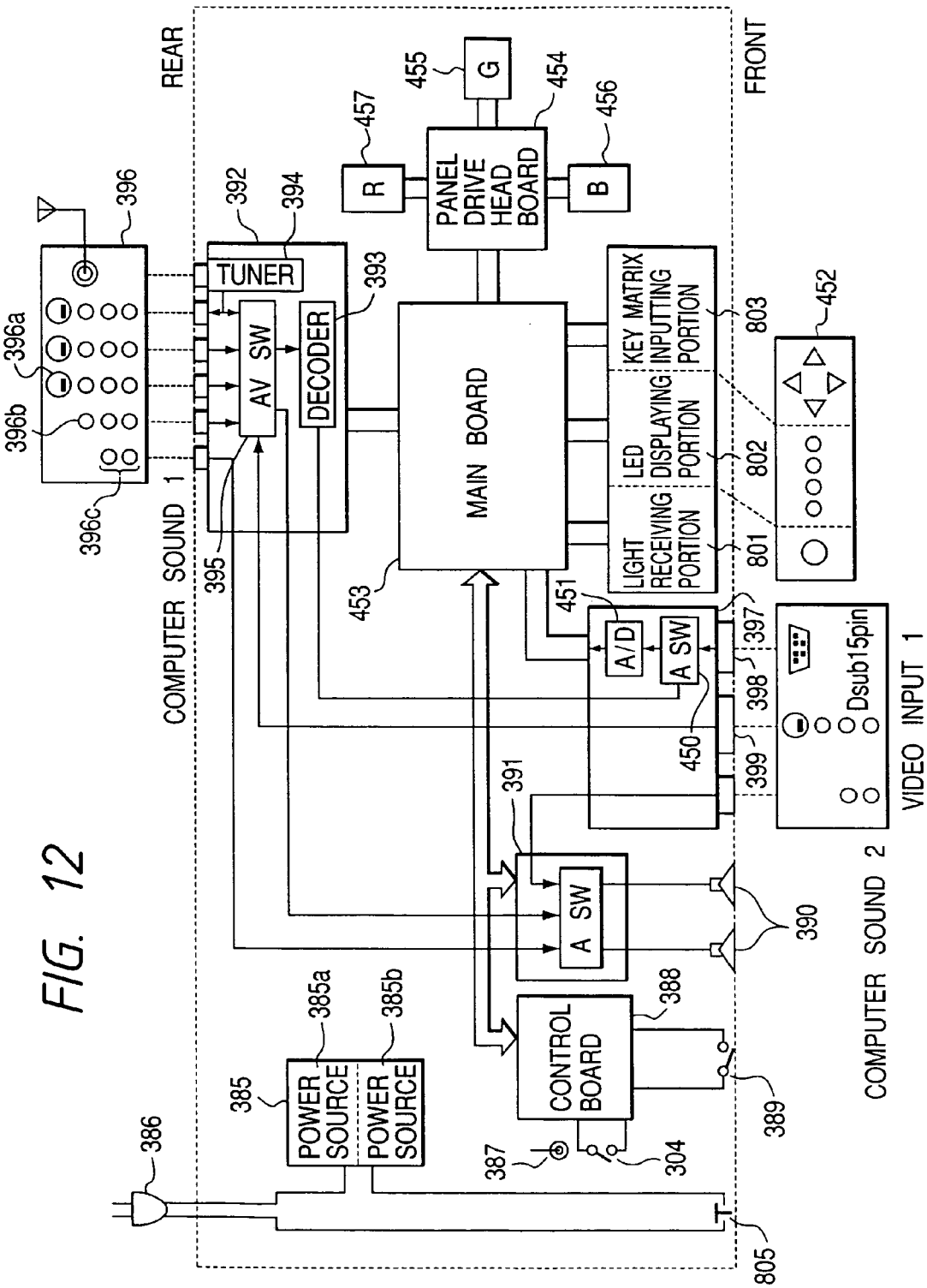
FIG. 12 is a circuit block diagram of the liquid crystal projector according to the present invention.

The peripheral electric circuit other than the liquid crystal panel is explained by reference to FIG. 12. In FIG. 12, the numeral 385 denotes a power source which is divided into a power source 385b for lamps and a power source 385a for signal processing circuit driving system; 386, a plug; 800, a main power supply switch; and 387, a lamp temperature detector. The lamp temperature detector controls the lamp through a control board 388, for example, to stop the lamp at an abnormal lamp temperature. 804 denotes a lamp safety switch. The numeral 389 denotes a filter safety switch for controlling the system. For example, it keeps the high-temperature lamp house box closed even when the box is tried to open. The numeral 390 denotes a speaker; 391 a voice board which may incorporate a processor of 3D sound, surround sound, or the like; and 392, an extension board 1. Extension board 1 has input terminals from external apparatus 396, selection switch 395 for selecting the signals, and tuner 394. The external apparatus has an S-terminal 396a for video signals, a video signal composite picture terminal 396b, and a sound terminal 396c. Signals are transferred through a decoder 393 to extension board 2, 800. Extension board 2 has a Dsub 15-pin terminal for a video apparatus or a computer to receive signals from another system, and the signals are converted to digital signals by A/D converter 451 through a changeover switch for changing to video signals from decoder 393.

The numeral 453 denotes a main board chiefly constituted of a memory like video RAM, and CPU. NTSC signals after A/D conversion by A/D converter 451 is stored once in the memory, and are treated for preparation of interpolation signals for vacant element not matching with the liquid crystal element number, for γ-conversion edge gradation adjustment, bright adjustment, bias adjustment, or other signal treatment. Computer signals other than NTSC signals can be treated for resolution conversion for example, VGA signals of a high resolution XGA panel. Main board 453 is capable also of synthesizing NTSC signals of plural picture data with computer signals. In FIG. 12, numeral 801 designates a light receiving portion for remote control, 802 an LED displaying portion, and 803 a key matrix inputting portion for adjustment. The output of main board 453 is treated for parallel/serial conversion, and is introduced in less noise-affectable state to panel drive head board 454. In head board 454, serial/parallel conversion is conducted again, and the signals are written into liquid crystal panels of B, G, R colors 455, 456, 457. The numeral 452 denotes a remote control panel to operate the computer screen in a simple manner as television. The respective liquid crystal devices 455, 456, 457 have the same constitution and have a color filter for respective colors, and as the horizontal/vertical scanning circuits, any of the ones described in First to Fifth Embodiments may be employed. The liquid crystal devices as described above are capable of treating picture image of not high resolution into high-quality picture images to give fine picture display.

In the present invention, the picture element electrode of the liquid crystal device may be polished by chemical mechanical polishing (CMP). By the chemical mechanical polishing, the surface of the picture element electrode can be finished to be extremely flat (in a mirror face state) advantageously. In the present invention, the technique is applicable which is disclosed by the inventors of the present invention in Japanese Patent Application No. 8-178711. This invention of Japanese Patent Application No. 8-178711 solves the problems below. The light introduced into a picture element electrode of a liquid crystal picture element is reflected in all directions owing to the surface roughness of the electrode to lower greatly the light reflection efficiency. Further, the surface roughness causes insufficient aligning in rubbing treatment in liquid crystal filling process. Consequently, the liquid crystal does not align satisfactorily, causing lower contrast to deteriorate the displayed picture quality. Furthermore, the groove portions between the picture element electrodes are not rubbed in the rubbing treatment, which causes insufficient aligning of the liquid crystal, and generates, coupled with the surface roughness, electric field in a lateral direction to cause bright lines to lower the contrast of the displayed picture. The above Japanese Patent Application relates to polishing of the picture element electrode by chemical mechanical polishing, whereby the surfaces of the picture element electrodes are mirror-polished and all of the picture element electrode surfaces are brought onto one and the same plane. Further, by conducting the above polishing after formation of the picture element electrodes on a formed insulating layer or after formation of an insulating layer on the picture element electrodes, the picture elements electrodes are embedded sufficiently in the insulating layer to make the surface completely flat. This flatness prevents the irregular reflection and defective alignment caused by the surface roughness, thereby giving high-quality image display.

This technique is explained by reference to FIGS. 13A to 13E and FIGS. 14F to 14H. FIGS. 13A to 13E and FIGS. 14F to 14H show the picture element portions of active matrix substrate applicable to reflection type liquid crystal devices. In the process of formation of the device, peripheral driving circuits including a shift register for driving the switching transistor of the picture element portion are simultaneously formed on one and the same substrate. The production process is described successively.

Figure 13A:
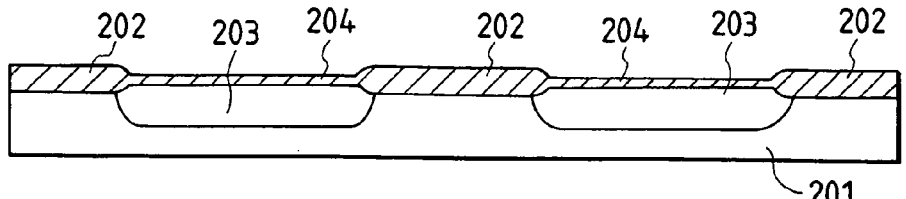
FIGS. 13A, 13B, 13C, 13D and 13E are schematic diagrams showing a production process of a liquid crystal device.

An n-type silicon semiconductor substrate 201 is thermally oxidized locally to form LOCOS 202. Thereto, by using the LOCOS 202 as the mask, boron ions are implanted at a dose of about $10^{12}$ cm$^{-2}$ to form p-type impurity region, PWL 203, having an impurity concentration of about $10^{16}$ cm$^{-3}$. This substrate 201 is again thermally oxidized to form gate oxidation film 204 having a thickness of 1000 Å or less (FIG. 13A).

Figure 13B:
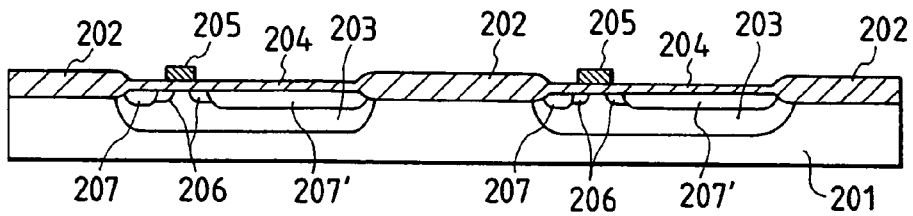

Gate electrodes 205 is formed which is composed of n-type polysilicon doped with phosphorus at a dose of about $10^{20}$ cm$^{-3}$. Then phosphorus ions are implanted over the entire face of substrate 201 at a dose of about $10^{12}$ cm$^{-3}$ to form n-type impurity regions, NLD 206, having an impurity concentration of about $10^{16}$ cm$^{-3}$. Subsequently, phosphorus ions are implanted by use of patterned photoresist as a mask in a dose of $10^{15}$ cm$^{-2}$ to form source/drain regions 207, 207' having an impurity concentration of about $10^{19}$ cm$^{-3}$ (FIG. 13B).

Figure 13C:
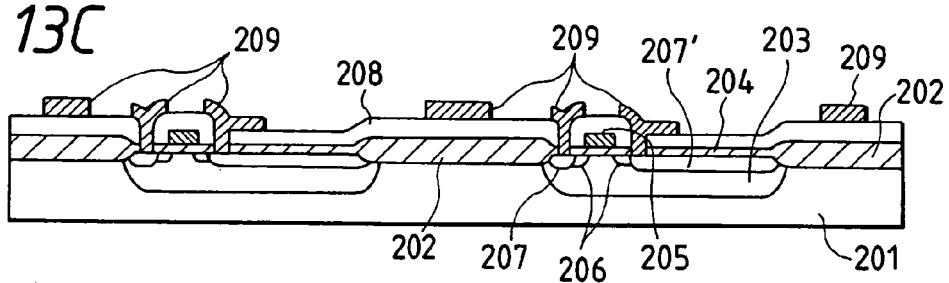

On the entire face of substrate 201, an interlayer film, PSG 208, is formed. This PSG 208 may be replaced by NSG (nondope silicate glass)/BPSG (boro-phospho-silicate glass), or TEOS (tetraethoxysilane). Contact holes are formed by patterning through PSG 208 on source/drain regions 207, 207'. Then Al is vapor-deposited by sputtering, and the deposited Al is patterned to form Al electrodes 209 (FIG. 13C). A barrier metal such as Ti/TiN is preferably formed between Al electrode 209 and source/drain regions 207, 207' to improve ohmic contact between Al electrode 209 and source/drain regions 207, 207'.

Figure 13D:
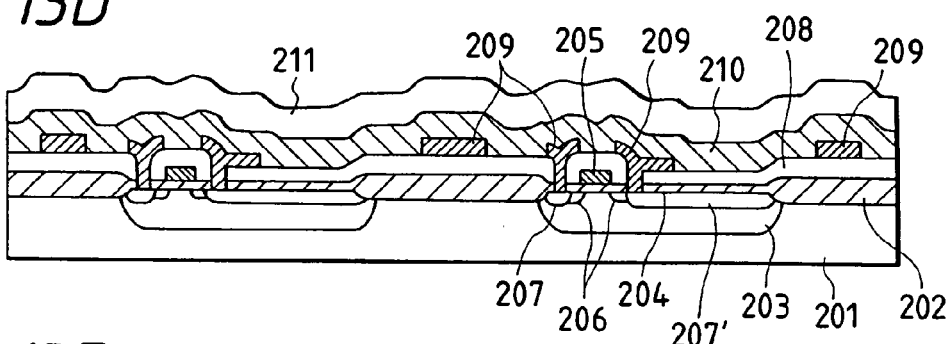

On the entire face of substrate 201, plasma SiN 210 is formed in a thickness of about 3000 Å, and then PSG 211 in a thickness of 10000 Å (FIG. 13D).

Figure 13E:
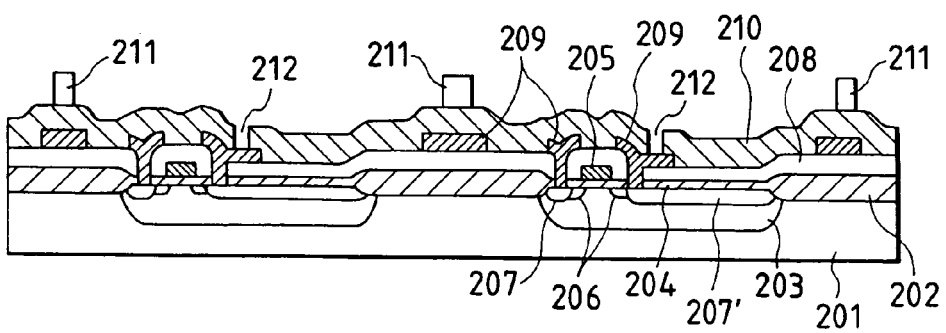

Utilizing plasma SiN 210 as a dry etching stopper layer, PSG 211 is patterned such that only the partition regions between picture elements remain unetched. Then, through-holes 212 are patterned by dry etching on Al electrodes 209 contacting with drain region 207' (FIG. 13E).

Figure 14F:
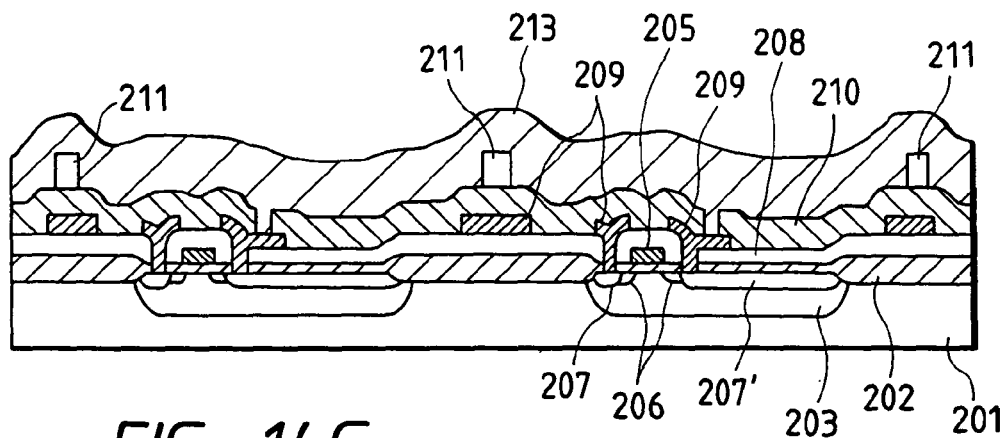
FIGS. 14F, 14G and 14H are schematic diagrams showing a production process of a liquid crystal device.

Picture element electrodes 213 is formed in a film of thickness of 10000 Å or more on substrate 201 by sputtering or by EB (electron beam) vapor-deposition (FIG. 14F). The material for picture element electrodes 213 is a metal film of Al, Ti, Ta, or W, or a film of a compound of the above metal.

Figure 14G:
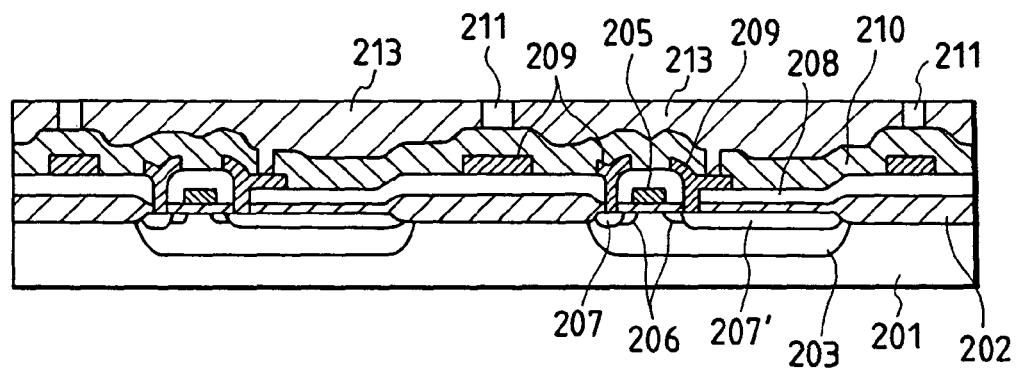

The surface of picture element electrode 213 is polished by CMP (FIG. 14G). The amount of polishing is in the range from x Å to x+10000 Å where x is the thickness (in Å) of the picture element electrode.

Figure 14H:
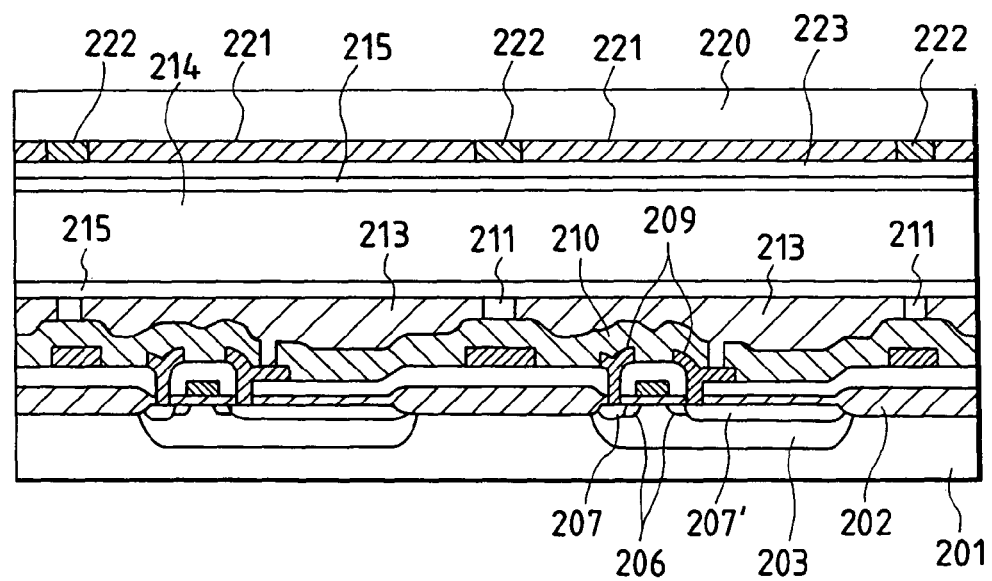

On the surface of the active matrix substrate prepared by the above process, alignment film 215 is formed. The surface of alignment film is treated for aligning such as rubbing treatment, and bonded to a counter electrode with interposition of a spacer (not shown in the drawing). Liquid crystal 214 is introduced into the interspace to complete the liquid crystal device (FIG. 14H). In this embodiment, the counter electrode is constituted of light-transmissive substrate 220, and color filter 221, black matrix 222, common electrode 223 composed of ITO or the like, and alignment film 215' formed on substrate 220.

In the active matrix substrate of this embodiment, as shown in FIG. 14H, the surface of the picture element electrode 213 is flat, and the surface of alignment film 215 is also flat and smooth owing to the embedded insulating layer in the gaps between the adjacent picture element electrodes. Therefore, this technique cancels the disadvantages caused by surface roughness of the picture element electrodes in prior art techniques, namely disadvantages of drop of light utilization efficiency by scattering of incident light, drop of contrast owing to poor rubbing, and occurrence of bright lines caused by lateral electric field resulting from level difference between the picture element electrodes, thereby improving the quality of the displayed picture image.

Fifth Embodiment

Fifth Embodiment is explained by reference to FIG. 15.

Figure 15:
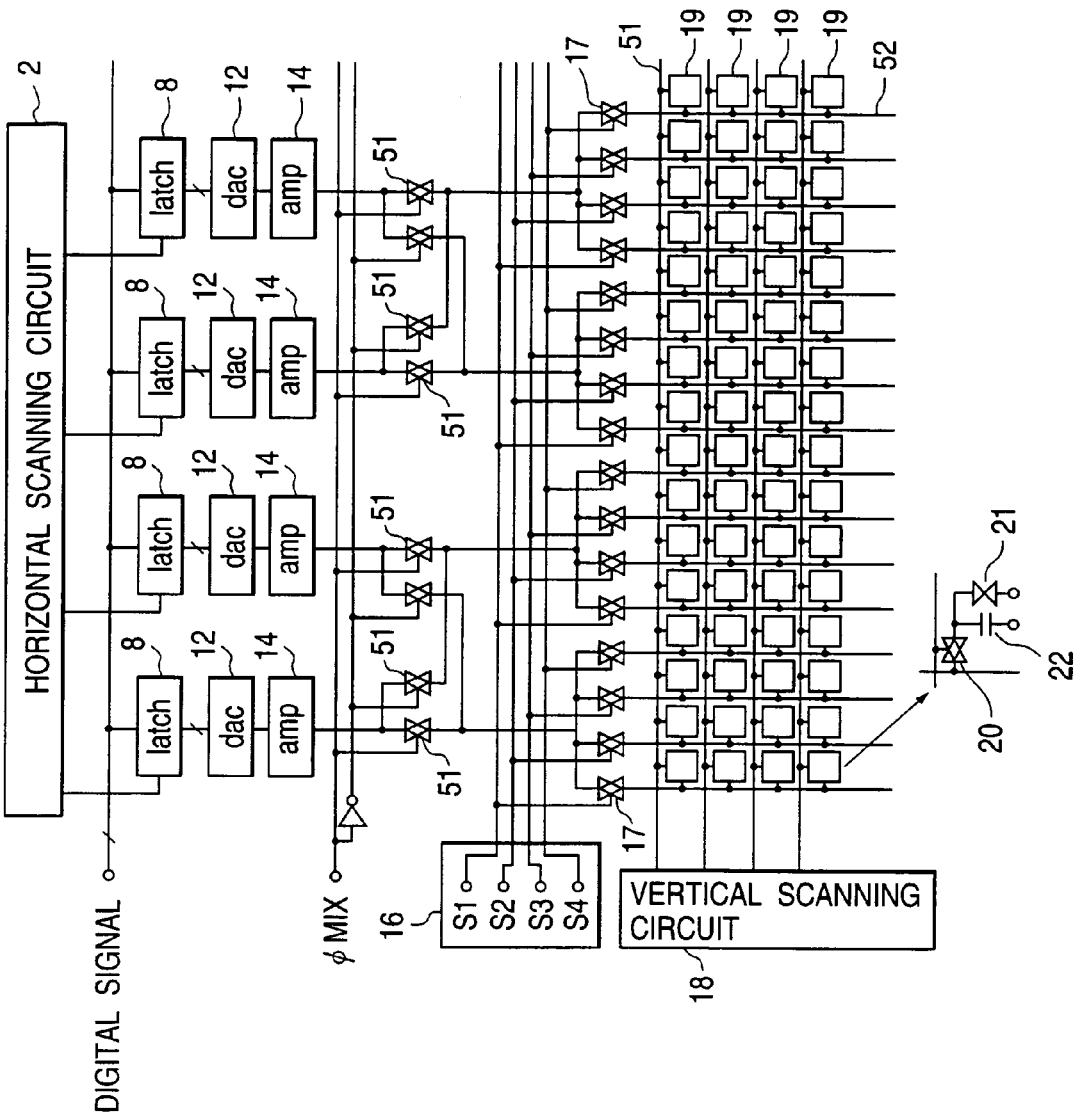
FIG. 15 is a circuit diagram of an example of a driving circuit of a liquid crystal panel of the present invention.

The embodiment shown in FIG. 15 resembles the one shown in FIG. 1, but is substantially different from it in that changeover means 51 (switch) is provided between D/A converter 12 and signal transfer switch 17 for switching the output of the D/A converter (buffer amplifier 14 may be omitted). In FIG. 15, the same parts are denoted by the same numerals as in FIG. 1 without detailed explanation of the respective parts.

In the embodiment shown in FIG. 15, digital picture signals are synchronized with the output from horizontal scanning circuit 2, and are memorized once in data latch circuits 8. The digital signals are converted to analog signals by D/A converter 12. The analog signals are introduced selectively to either one of two transfer switch groups 17 by D/A-converter output switching means, and transfer switches 17 are selectively turned on by transfer switch-selection means 16 to transfer the analog picture signals through transfer switches 17 to vertical signal lines 52. The vertical scanning circuit 18 selects the scanning lines 51 to write the picture signals to the picture elements. Thus, picture display is conducted.

Generally, since the characteristics of the D/A converters and the buffer amplifiers differ slightly from each other, the brightness can differ for every picture element block where picture signals are written from the same one D/A converter, for example, for every 4-picture elements in FIG. 1. To avoid this, in this embodiment, D/A converter changeover means are employed so that the one picture element not connected always to the same D/A converter. Thereby, the difference of brightness can be decreased between the picture element blocks, the blocks having four picture elements respectively in this embodiment, to realize higher quality display.

Figure 16:
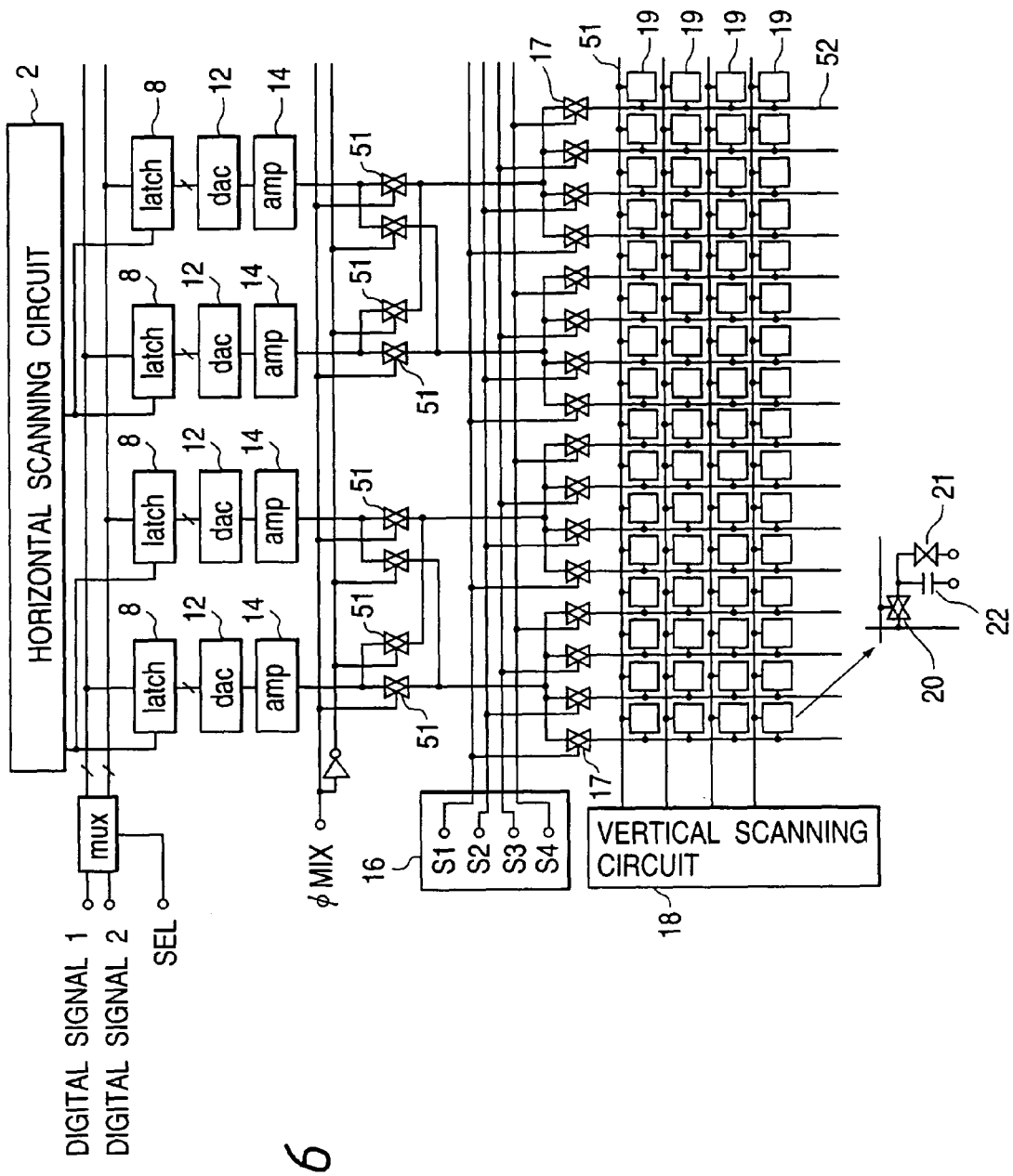
FIG. 16 is a circuit diagram of another example of a driving circuit of a liquid crystal panel of the present invention.

Next, the embodiment shown in FIG. 16 is explained. Being different from the one shown in FIG. 15, the circuit shown in FIG. 16 has a constitution that the digital picture signals to be inputted are divided into plural signal divisions, and picture signal changeover (multiplexing) means 55 is provided to switch the picture signals. In the embodiment shown in FIG. 16, the picture signals are written into prescribed picture elements by switching the signals by multiplex circuit 55 to prevent failure of writing into prescribed picture display element on switching the D/A converter output.

With the embodiments of FIG. 15 and FIG. 16, picture image of excellent quality is displayed irrespectively of variation of D/A converter characteristics.

Sixth Embodiment

The sixth embodiment is explained by reference to FIG. 17.

Figure 17:
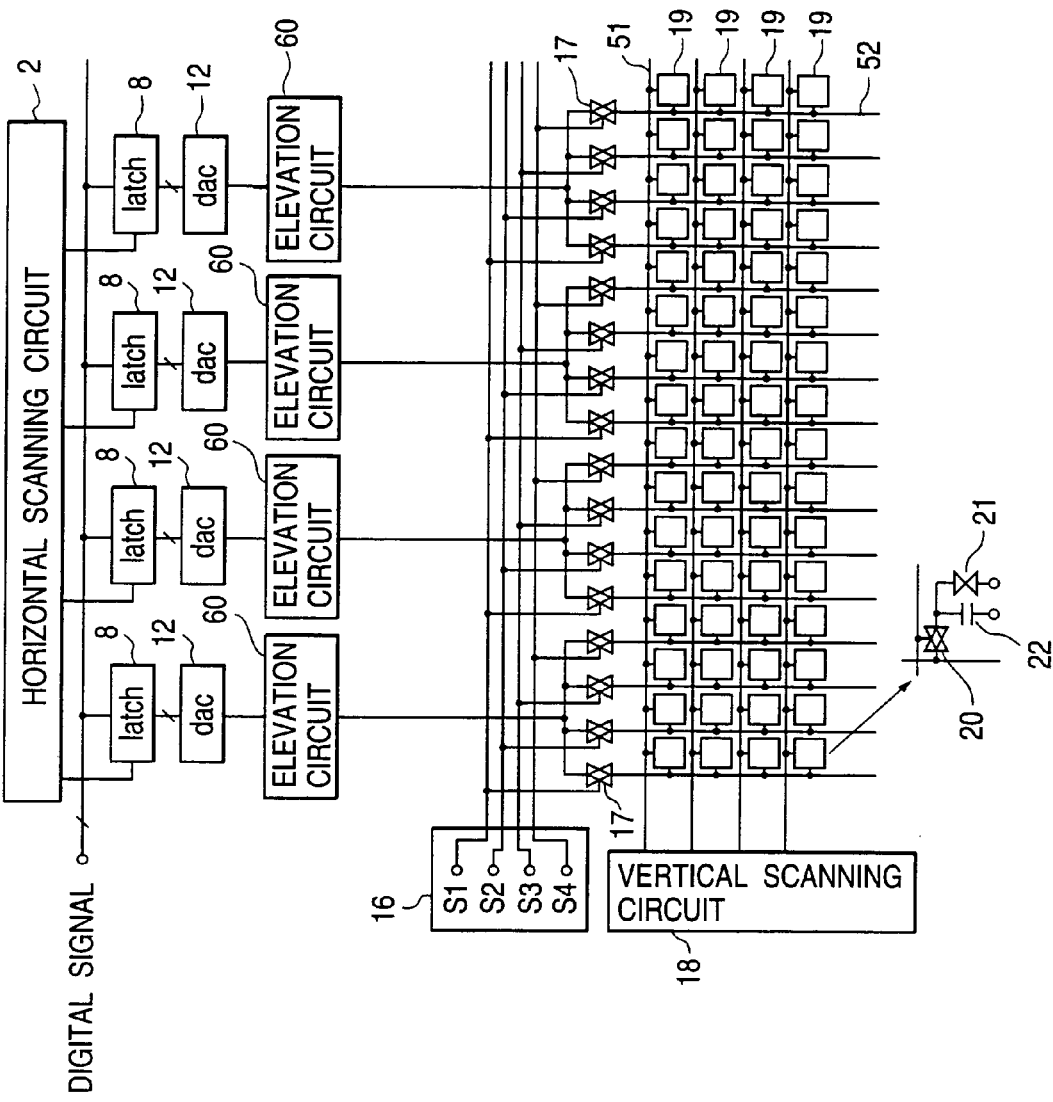
FIG. 17 is a circuit diagram of still another example of a driving circuit of a liquid crystal panel of the present invention.

The embodiment shown in FIG. 17 resembles the one shown in FIG. 1, but is substantially different from it in that booster circuits 60 for boosting the output of the D/A converters are provided between D/A converters 12 and signal transfer switches 17. In FIG. 17, the same parts are denoted by the same numerals as in FIG. 1 without detailed explanation of the respective parts.

In the embodiment shown in FIG. 17, digital picture signals are synchronized with the output from horizontal scanning circuit 2, and are memorized once in data latch circuits 8. The digital signals are converted into analog signals by D/A converters 12. The analog signals are amplified to a prescribed amplitude by booster circuits 60, and are introduced selectively to either one of transfer switches 17 selected by D/A-converter output switching means 16 to transfer the analog picture signals through transfer switches 17 to vertical signal lines 52. The vertical scanning circuit 18 select the scanning lines 51 to write the picture signals to the picture elements. Thus, picture display is conducted.

Generally, the liquid crystal device is driven with inversion to prevent deterioration of the liquid crystal. As the result, the amplitude of the voltage applied to the liquid crystal becomes significantly high, about 10 volts or more depending on the liquid crystal material. In this embodiment, the output of the D/A converters is boosted by the booster circuit, so that the power source voltage in the D/A converter can be lowered to save power in this section.

Figure 18:
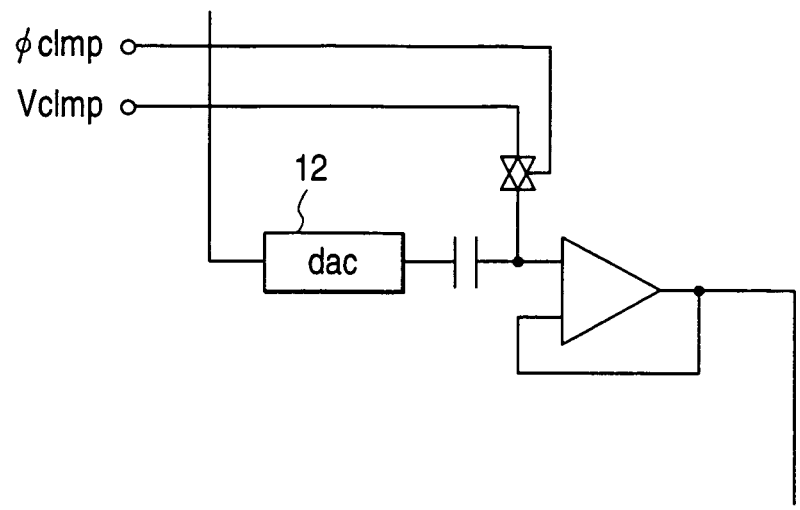
FIG. 18 is an equivalent circuit diagram of an output-elevation circuit for elevating the output of a D/A converter applicable to the present invention.
Figure 19:
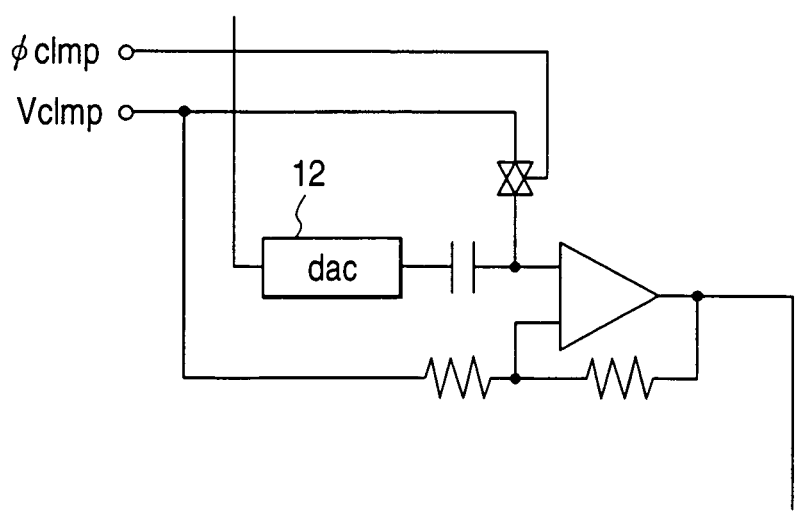
FIG. 19 is an equivalent circuit diagram of another output-elevation circuit for elevating the output of a D/A converter applicable to the present invention.

FIGS. 18 and 19 are equivalent circuit diagrams of examples of the booster circuit. In these examples, the booster circuit is a clamp type amplifier having capacitive coupling in the input portion, and the clamp level can be set as desired. FIG. 18 shows the circuit for the gain of 1. FIG. 19 shows the circuit in which the gain can be set by resistance division. FIGS. 20A to 20D shows conceptionally the operation data. The output from the D/A converter is changed as shown in FIG. 20A by bit inversion in every inversion cycle. However, the signals applied to the liquid crystal should be inverted with the center of the inversion at the voltage of the counter electrode. Therefore, Vclmp is changed in correspondence with the inversion cycle to turn ϕclmp on before read-out from the D/A converter as shown in FIG. 20C to change the standard voltage of the amplifier. Thereby the output signals are changed as shown in FIG. 20D. Thus, the inversion driving can be conducted without elevation the power source voltage of the D/A converter. With this embodiment, the voltage of the D/A converters can be lowered.

Seventh Embodiment

Figure 21:
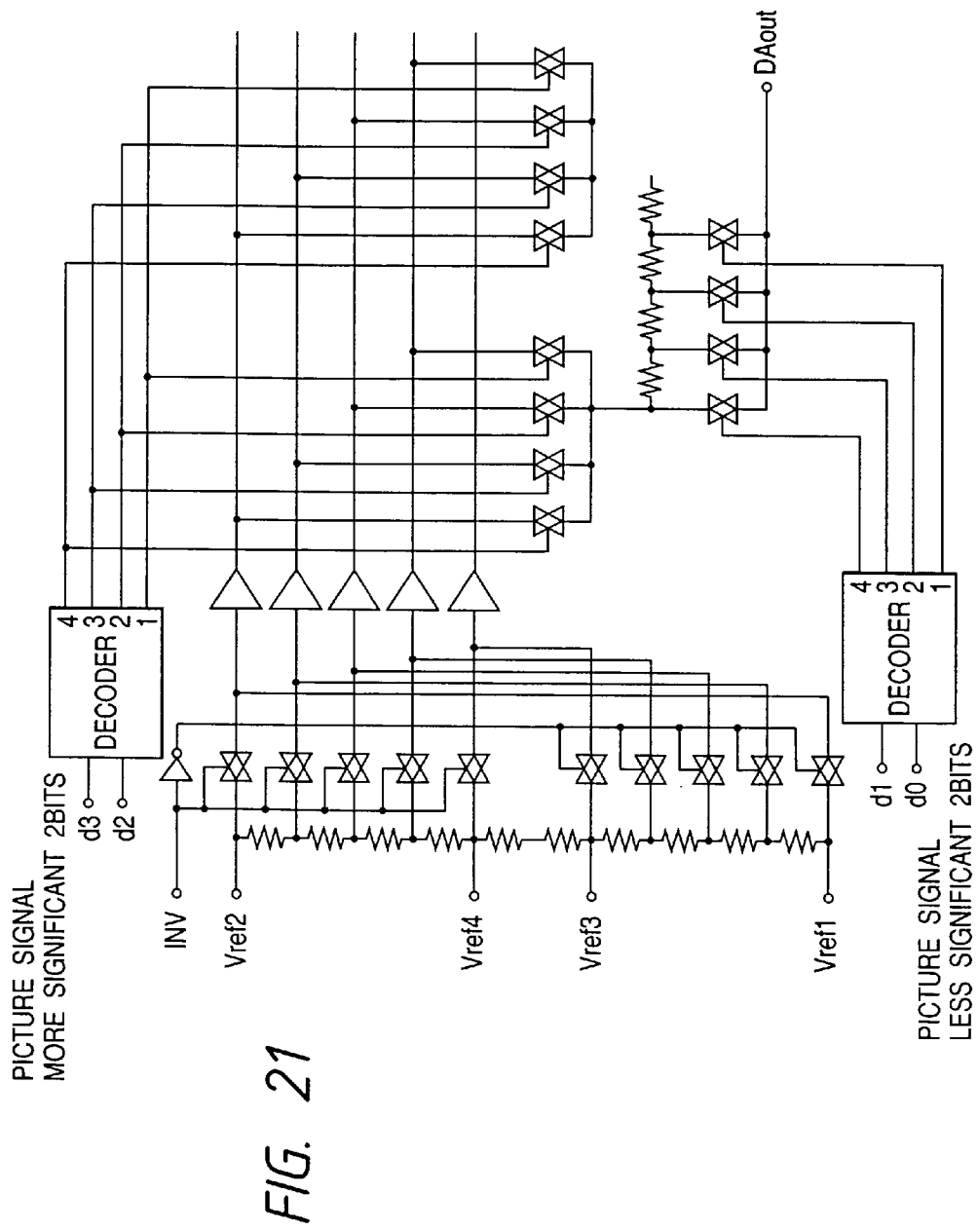
FIG. 21 is an equivalent circuit diagram of a D/A converter.

FIG. 21 is an equivalent circuit diagram of the D/A converters of this embodiment. FIG. 21 shows the case of the picture signals of 4 bits. This embodiment comprises a circuit for providing two kinds of five reference voltages by resistance division, a means for selecting one of the two kinds of five reference voltages by polarity inversion signal, a circuit for selecting two reference voltages of the five reference voltages by decoding more significant two bits, a circuit for separating the voltage between the two reference voltages by resistance, and a means for selecting one of the above voltages divided by the resistance by decoding the less significant two bits. In FIG. 21, the circuit for providing two kinds of the reference voltages employs four voltages of Vref 1 to Vref 4. However, application of Vref 3 and Vref 4 are not necessary (essential when the central two resistances are absent).

Figure 22:
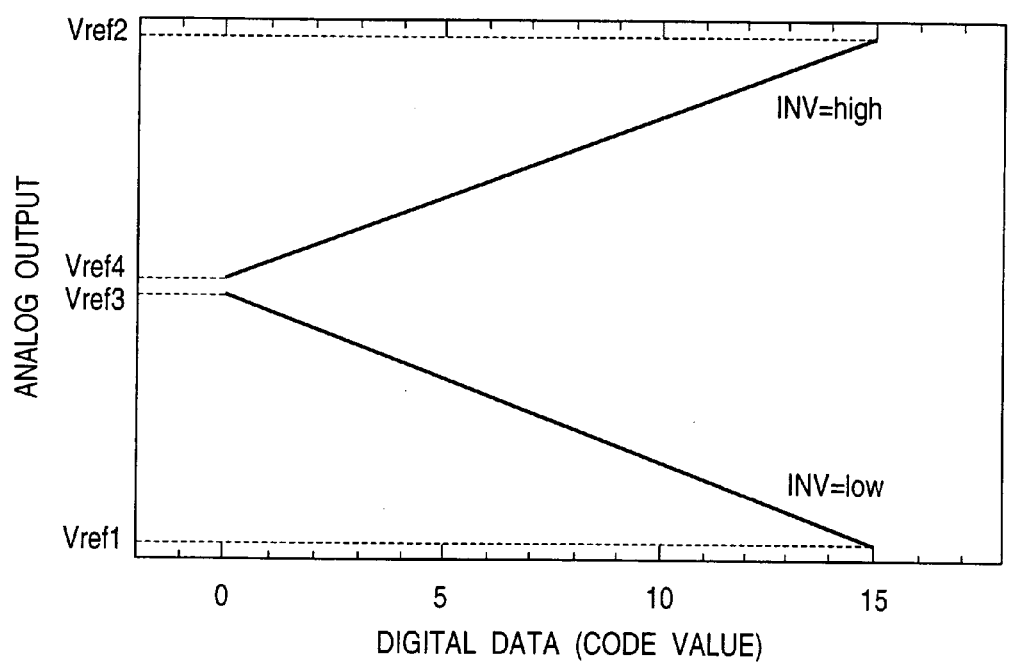
FIG. 22 is a schematic diagram showing conversion characteristics of a D/A converter.

Liquid display apparatuses are generally driven with inversion to prevent deterioration of the liquid crystal material. In this embodiment, two kinds of the reference voltage groups are generated for normal drive and reverse drive of the D/A converter, and the voltage groups are switched in every inversion cycle to invert the drive. In other words, the switches are changed over by inputting INV pulses to invert the reference voltage. The voltage division ratios are decided in consideration of the voltage-brightness characteristics of the liquid crystal. The outputted analog signals depend on dynamic range of Vref 4 to Vref 2 for normal drive (INV: high), and Vref 1 to Vref 3 for reverse drive (INV: low). In normal drive (INV: high), the five reference voltages are the voltages of from Vref 4 to Vref 2 divided by the resistance. One of the four groups of two adjacent reference voltages is selected by signals obtained by decoding the more significant two bits of the picture signals. The another resistance division obtains four voltages between the two adjacent reference voltages selected above. Further, one of the four voltages is selected by decoding the less significant two bits of the picture signals. In such a manner the digital-analog conversion is conducted. FIG. 22 shows the digital-analog conversion characteristics of the D/A converter of this embodiment.

Figure 23A:
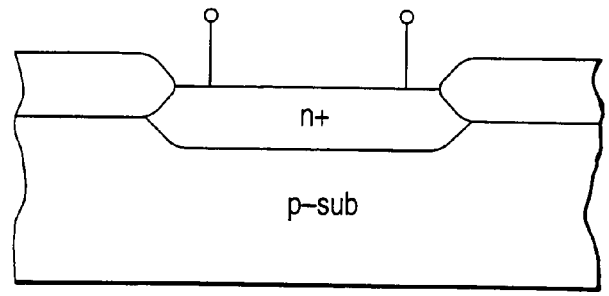
FIGS. 23A and 23B are schematic diagrams of a resistance element.
Figure 23B:
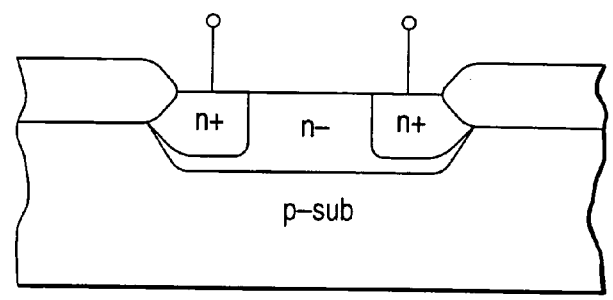

In constituting resistance elements in semiconductor integrated circuit, as shown in FIGS. 23A to 23B, a second conduction type diffusion layer is generally formed in a first conduction type well. The reverse bias applied to this pn junction broadens the depletion layer at the junction portion. Thus the breadth of the depletion layer varies depending on the bias state. Therefore, the resistance depends on the bias. In this embodiment, the resistance element for the more significant bit, namely the reference voltage portion, may be formed by a diffusion layer of a high concentration (preferably $10^{19}$ $cm^{-3}$ or more) as shown in FIG. 23A, and the resistance element for the less significant bit may be formed by a diffusion layer of a low concentration as shown in FIG. 23B. Generally, since the breadth of the depletion layer is proportional to ½-th power of the reciprocal of the impurity concentration, the more significant bit employs a high-precision resistance element which is less bias-dependent, and the less significant bit employs a small-area high-resistance bias-dependent element. In the less significant bits, since the biases for the respective resistance differ not so much, the resistance values also differ not so much. Therefore, a diffusion layer of low concentration is preferred for constituting a small area resistance element. On the other hand, in more significant bit, the bias states of respective resistance element differs greatly, so that use of less bias-dependent resistance element is necessary.

By use of the D/A converter of this embodiment, monotone of the D/A converter is ensured, the accuracy is improved, and the circuit area can be decreased.

Eighth Embodiment

Figure 24:
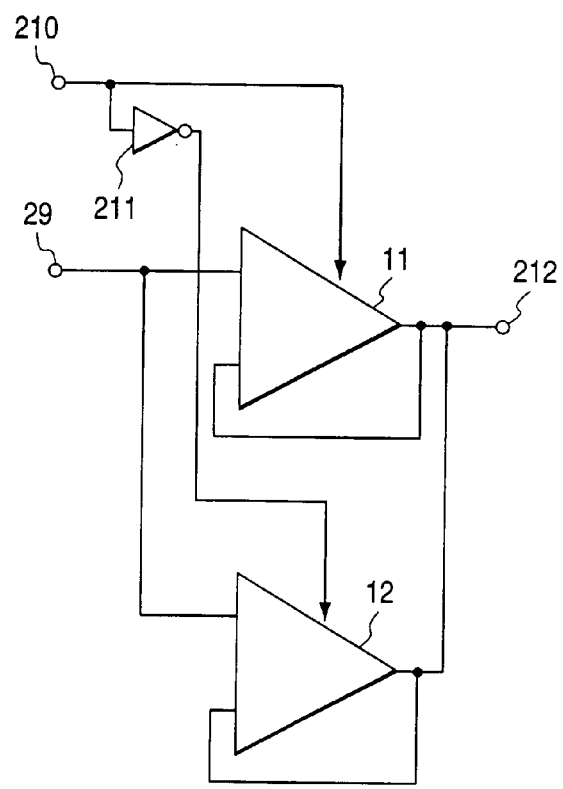
FIG. 24 is a schematic diagram of a buffer circuit.

An improved buffer circuit is explained which is applicable to the D/A converter employed in the present invention. FIG. 24 shows the constitution of the buffer circuit. This buffer circuit is constituted of two buffer circuits 11, 12 having different output range, a changeover switch, and a bias circuit.

The buffer circuit generally cannot cover the entire of the output range of the power source voltage (from VSS to VDD). In buffer circuit 11, with the approach of the input voltage to the power source voltage VDD, the D-S voltage of p-type transistor 30, 31 becomes smaller to bring the operation to the linear region. As the results, the electric current supplied by transistor 30, 31 becomes smaller gradually, the maximum operation frequency becomes lower gradually, and the voltage finally reaches the upper limit of the output voltage. On the other hand, the input near the VSS level is not limited as above, and voltage output near VSS side can be possible. Therefore, buffer circuit 11 has broader output range in the low voltage side. On the other hand, in buffer circuit 12, with the approach of the input voltage to VSS, n-type transistor 37, 38 enters the linear region. Therefore, buffer 12 has broader output range in the high voltage side in contrast to buffer 11.

Generally, the liquid crystal device is driven with inversion to prevent deterioration of liquid crystal. Therefore, in this embodiment, the two buffer circuits having a different output range are employed and are changed over for normal driving and reverse driving, thereby substantially wider output range being obtained at a lower power source voltage.

Figure 25:
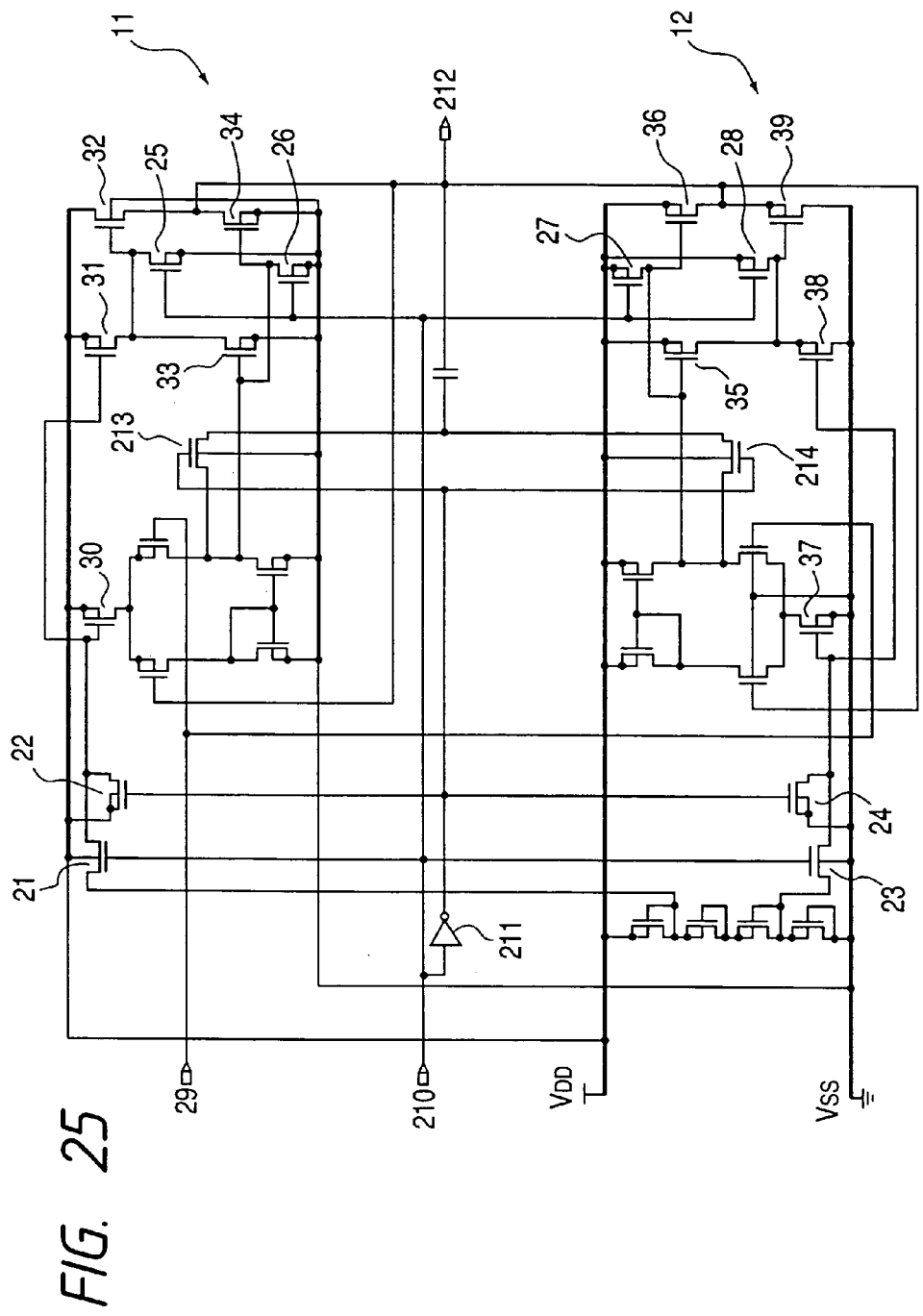
FIG. 25 is a circuit diagram of a buffer circuit.

The operation is described in more detail by reference to FIG. 25. A voltage inputted to terminal 29 is outputted from the buffer circuit selected by changeover switches 21-28 selected by the inversion signal inputted to inversion signal input terminal 210 and the output signal from circuit 211 for inverting the inversion signal inputted to inversion signal input terminal 210. Changeover switches 21, 22, 27, and 28 are p-type transistor, and changeover switch 23, 24, 25, and 26 are n-type transistors. At the high level of the inversion signal inputted to inversion signal input terminal 210, the changeover switches 22, 23, 25, 26, and 214 are conductive, and changeover switch 21, 24, 27, 28, and 213 are non-conductive. In this state, buffer circuit 24 of circuit 12 outputs the signal, and buffer circuit 11 is shut down with the gates of transistors 30, 31, 32, 33, and 34 kept turned off.

With this constitution, the intended buffer circuit can be selected according to an input voltage level. Thus a broader output range can be obtained, and increase of the power consumption is prevented since no current flows through non-operating buffer circuit.

Ninth Embodiment

The single panel type full color display apparatus is explained which employs the liquid crystal device (panel) equipped with microlenses.

The inventors of the present invention disclosed a novel display panel in Japanese Patent Application No. 9-72646 to solve the disadvantage of conventional projection type display apparatus that the mosaic structure of R, G, and B is conspicuous to lower the quality of the displayed picture image. The display panel disclosed in this Japanese Patent Application No. 9-72646 comprises a picture unit array and a microlens array: the picture unit array having picture element units arranged two-dimensionally at a prescribed pitch on a substrate, the picture element unit having three color picture elements, and a combination of a first and second color picture elements being arranged in a first direction and another combination of the first and a third color picture elements being arranged in a second direction with the first color element common to the both combinations; and the microlens array being arranged two-dimensionally above the picture element unit array at the pitch corresponding to the pitches of two color picture element combinations arranged in the first and second directions on the substrate.

In this embodiment, application of the display panel disclosed in the above Japanese Patent Application No. 9-72646 to the liquid crystal device and the display apparatus of the present invention.

FIGS. 26A to 26C show roughly the principal portion of the optical system of a projection type liquid crystal display apparatus employing the display panel of the above patent application. FIG. 26A is the plan view, FIG. 26B is the front view, and FIG. 26C is the side view.

In FIG. 26A to 26C, projection lens 1 projects, onto a projection plane, picture image information displayed on display panel (liquid crystal panel) 2 employing the liquid crystal device equipped with microlenses. The numeral 3 denotes a polarized light beam splitter (PBS) transferring, for example, S-polarized light and reflecting P-polarized light; 40, an R(red light)-reflecting dichroic mirror; 41, a B/G(blue and Green light)-reflecting dichroic mirror; 42, a B(blue light)-reflecting dichroic mirror; 43, a high-reflectance mirror for reflecting all colors; 50, a Fresnel lens; 51, a convex lens; 6, a rod type integrator; 7, an ellipsoidal reflector; 8, an arc lamp (light source) of metal halide, UHP, or the like; 8a, a light-emitting face of the arc lamp placed at the center of the ellipsoidal reflector.

Figure 27A:
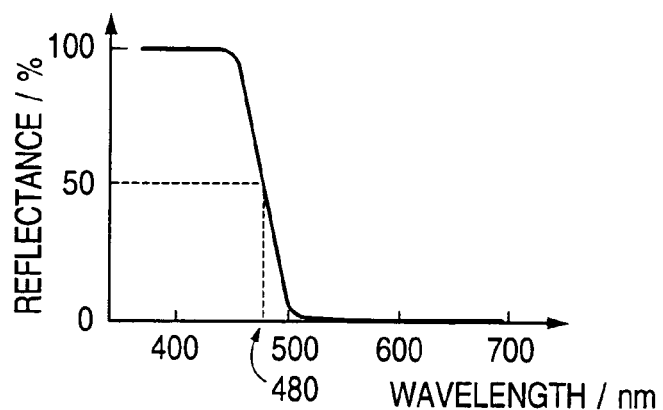
FIGS. 27A, 27B and 27C are spectral reflection characteristic diagrams of a dichroic mirror employed in a projection type display apparatus of the present invention.
Figure 27B:
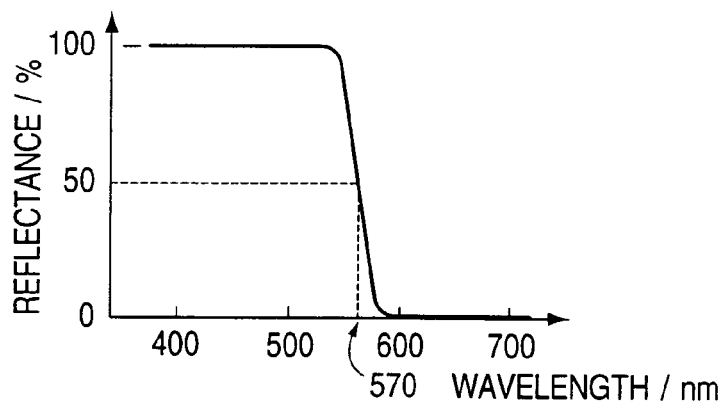
Figure 27C:
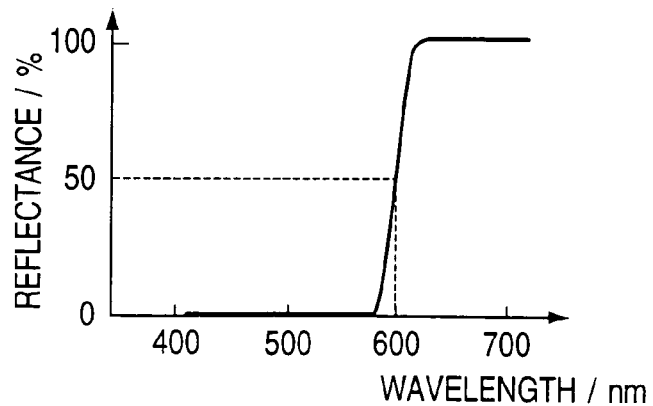
Figure 28:
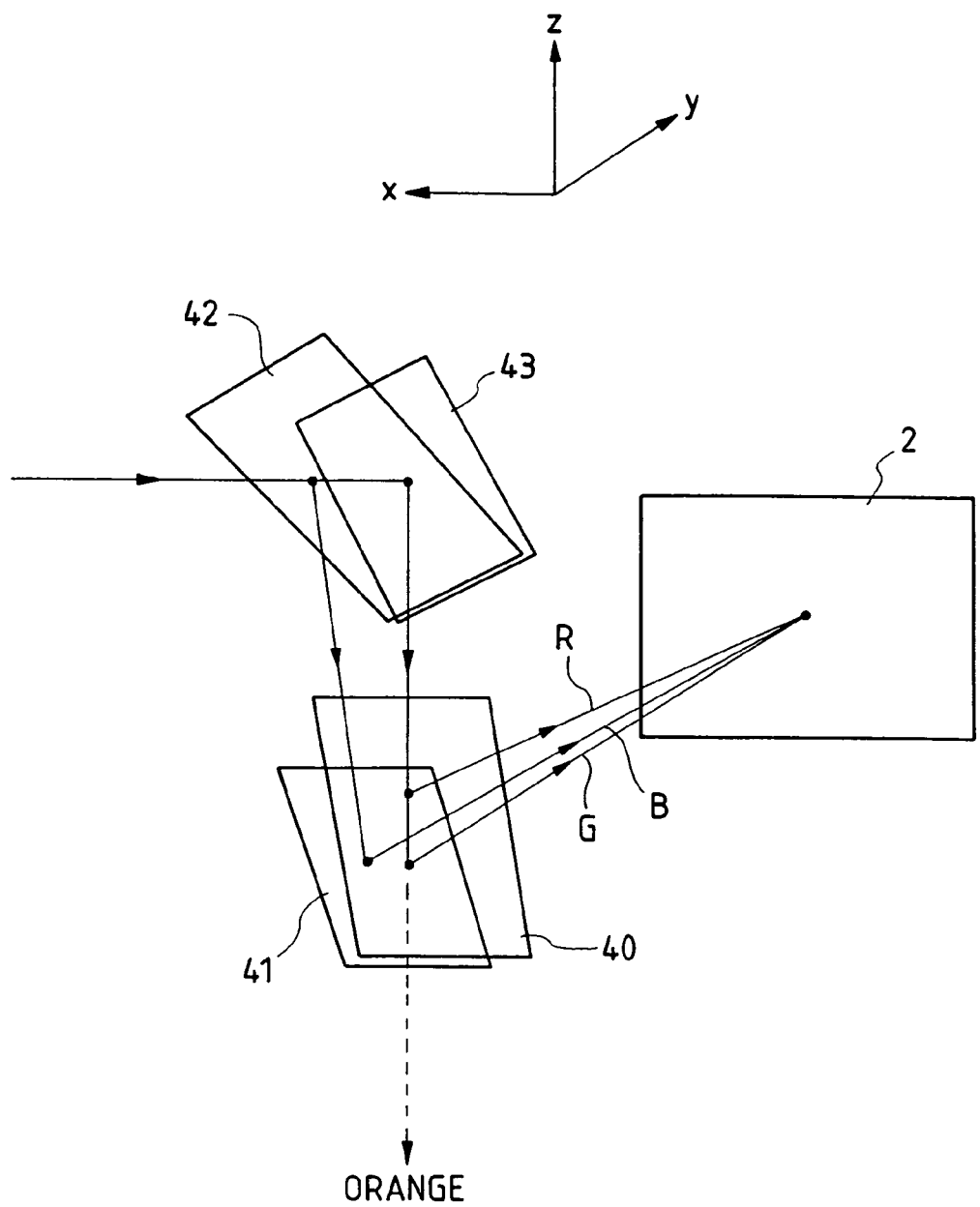
FIG. 28 is a perspective view of a color separation illumination portion of a projection type display apparatus of the present invention.

R(red light)-reflecting dichroic mirror 40, B/G(blue and green light)-reflecting dichroic mirror 41, and B(blue light)-reflecting dichroic mirror 42 have spectral reflection characteristics respectively as shown in FIGS. 27C, 27B, and 27A. These dichroic mirrors together with high-reflectance mirror 43 are arranged three-dimensionally as shown in FIG. 28. In FIG. 28, the mirror 43 relates to G/R reflecting. The mirrors separate white illumination light emitted from light source 8 into three colors of R, G, and B and serve to illuminate liquid crystal panel 2 by the respective colors from three-dimensionally different directions.

The description is made in accordance with the traveling course of the light flux from light source 8. The white light emitted for lamp 8 is focused on inlet (incidence face) 6a of integrator 6 by ellipsoidal reflector 7. The light flux is made uniform in spacial intensity distribution during traveling through integrator 6 with repeated reflection therein. The light flux emitted from emission outlet 6b of integrator 6 is changed to parallel in the x-axis direction (in FIG. 26B) by convex lens 51 and Fresnel lens 50, and reaches B-reflecting dichroic mirror 42.

At B-reflecting mirror 42, B light (blue light) only is reflected downward (in FIG. 26B) in the z-axis direction at a prescribed angle to the z-axis toward R-reflecting dichroic mirror 40. The colored light (R/G light) other than the B light passes through B-reflecting dichroic mirror 42, and is reflected by high-reflectance mirror 43 at a right angle in the z-axis direction (downward) toward R-reflecting dichroic mirror 40.

B-Reflecting dichroic mirror 42 and high-reflectance mirror 43, in FIG. 26A, are both placed so as to reflect the light flux from integrator 6 in the z-axis direction (downward). High-reflectance mirror 43 is tilted with a turning axis of the y-axis direction at a tilting angle of just 45° relative to the x-y plane. B-Reflecting mirror 42 is also tilted also with a turning axis of the y-axis direction at a tilting angle of less than 45° relative to the x-y plane. Thereby, the R/G light is reflected by high-reflectance mirror 43 in the z-axis direction, whereas the B light is reflected by B-reflecting dichroic mirror 42 downward at a prescribed angle to the z-axis (tilted in the x-z plane). In order to make coincident the illumination areas of B light and R/G light on liquid crystal panel 2, the degrees of the shift and tilt of high-reflectance mirror 43 and B-reflecting dichroic mirror 42 are adjusted such that the main rays of the respective colors intersect at liquid crystal panel 2.

The R/G/B light directed downward (in z-axis direction) as mentioned above travels toward R-reflecting dichroic mirror 40 and B/G-reflecting dichroic mirror 41 which are placed below B-reflecting dichroic mirror 42 and high-reflectance mirror 43. B/G-reflecting dichroic mirror 41 is tilted with a tilting axis in the x-axis direction at a tilting angle of just 45° relative to the x-y plane. R-Reflecting mirror 40 is also tilted with a tilting axis in the x-axis direction at a tilting angle of less than 45° relative to the x-z plane.

Thereby, of the introduced R/G/B light, the B/G light passes through R-reflecting dichroic mirror 40, being reflected by B/G-reflecting dichroic mirror 41 at a right angle in y-axis positive direction, being polarized PBS 3, and illuminating liquid crystal panel 2 placed horizontally in the x-z plane.

Of the introduced R/G/B light, the B light, which is traveling as mentioned above (see FIG. 26A and FIG. 26B) at a prescribed angle relative to the x axis (tilted in the x-z plane), is reflected by B/G reflection dichroic mirror 41, and illuminates liquid crystal panel 2 at a prescribed angle relative to the y-axis (tilted in the x-y plane).

The G light is reflected by B/G dichroic mirror 41 at a right angle in the y-axis positive direction, being polarized by PBS 3, and illuminating liquid crystal panel perpendicularly, namely at an incident angle of 0°.

The R light is reflected by R-reflecting dichroic mirror 40 placed before B/G-reflecting dichroic mirror 41 in a y-axis positive direction, traveling the y-axis positive direction at a prescribed angle relative to the y-axis (tilted in the x-y plane) as shown in FIG. 26C, being polarized by passing through PBS 3, and illuminating liquid crystal panel 2 at an incident angle (in the y-z plane direction) of the above prescribed angle to the y-axis.

In order to make coincident the illumination areas of colors of R, G, and B on liquid crystal panel 2, the degrees of the shift and tilt of B/G-reflecting dichroic mirror 41 and R-reflecting dichroic mirror 40 are adjusted, similarly as above, such that the main rays of the respective colors intersect at liquid crystal panel 2.

The cutoff wavelength of B/G-reflecting dichroic mirror 41 is 570 nm, and that of R-reflecting dichroic mirror 40 is 600 nm as shown in FIGS. 27A to 27C. Therefore, unnecessary orange light passes through B/G-reflecting dichroic mirror 41, and is led to the outside of the optical path to obtain optimum color balance.

As described later, the colors of R, G, and B are respectively reflected and polarization-modulated, are introduced again to PBS 3, reflected at PBS face 3a of PBS 3 in the x-axis positive direction. The light flux is introduced to projection lens 1. Projection lens 1 enlarges and projects the picture image displayed on liquid crystal panel 2 onto a screen (not shown in the drawing).

The light fluxes of R, G, and B are introduced respectively to liquid crystal panel 2 at different incident angles, and therefore are reflected at different reflection angle. Accordingly, the projection lens 1 used has a sufficient diameter and a sufficient aperture to receive all of the light fluxes. Incidentally, the tilting angles of the light fluxes introduced to projection lens 1 are paralleled by passing forward and backward through the microlenses to retain the tilting of the incident angles to liquid crystal 2.

Figures 38, 39:
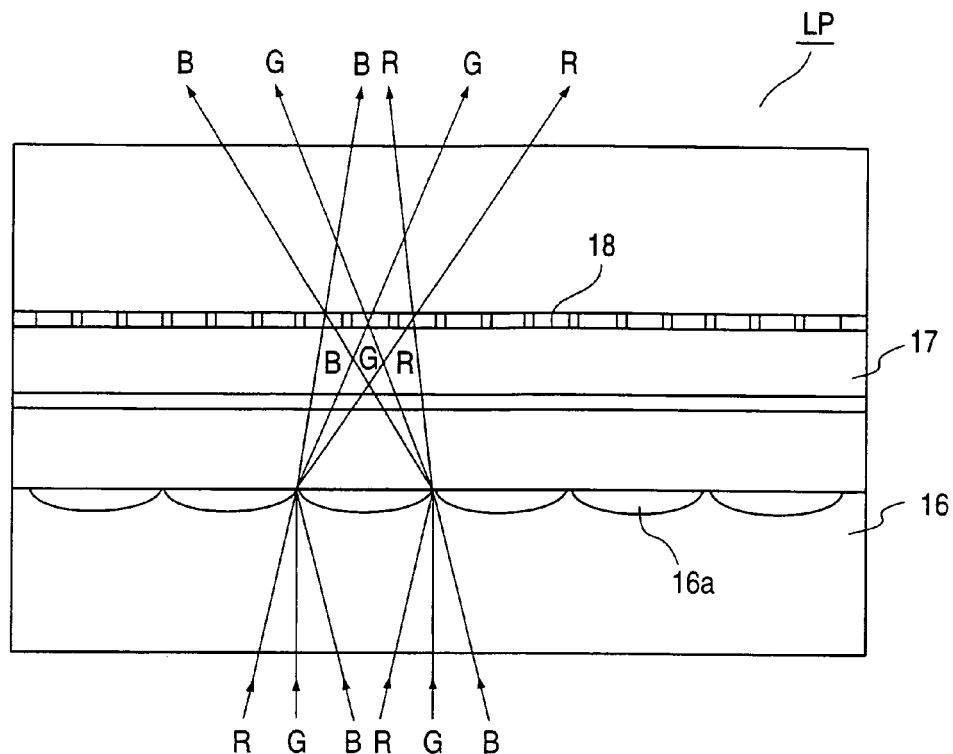
FIG. 38 is a partial enlarged sectional view of a conventional transmission type liquid crystal panel having a microlens.
FIG. 39 is a diagram showing a part of enlarged projected image on a screen of a conventional display apparatus employing a transmission type liquid crystal panel having a microlens.
Figure 40:
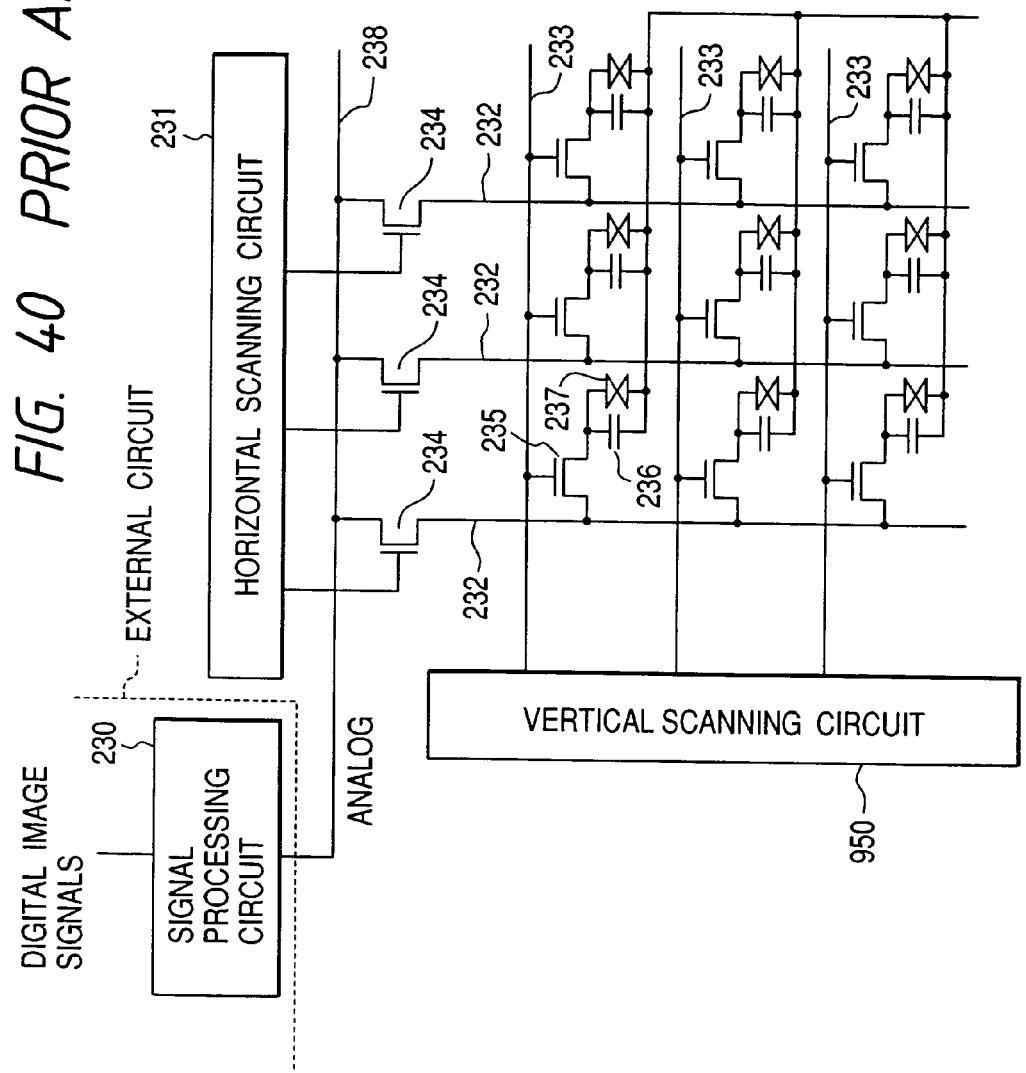
FIG. 40 is a schematic diagram showing an example of a conventional liquid crystal device.
Figure 41:
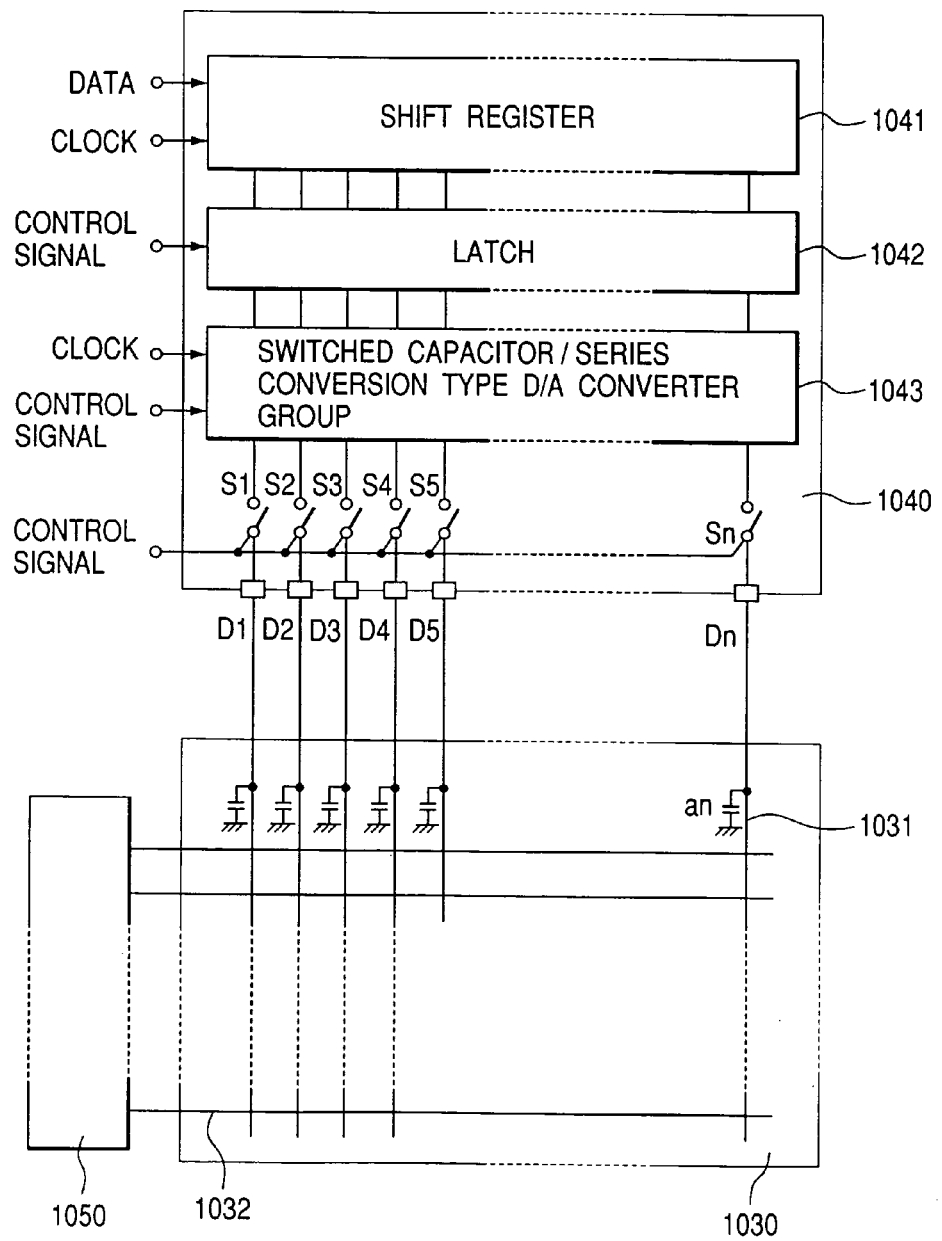
FIG. 41 is a schematic diagram showing another example of a conventional liquid crystal device.

On the other hand, in a conventional transmission type liquid crystal panel LP, as shown in FIG. 38, the light flux emitted from liquid crystal panel LP diverges greatly, coupled with condensing action of microlenses 16, so that a large projection lens having a larger numerical aperture is required to receive the light fluxes.

In FIG. 38, the numeral 16 indicates a microlens array in which plural microlenses 16a are arrayed at a prescribed pitch; 17, a liquid crystal layer; 18, color picture elements of R (red), G (green), or B (blue).

In FIG. 38, the illuminating light fluxes of R (red), G (green), and B (blue) are introduced at different angles to liquid crystal LP, and the respective color light fluxes are introduced to different color picture elements 18. Thus a display panel is constituted which requires no color filter, and exhibits high light utilization efficiency. The conventional projection type display apparatus employing such a display panel is capable of displaying by projection bright full color picture images even with a single panel type liquid crystal panel.

Conventionally, in such a projection type display apparatus employing a display panel with microlenses, the mosaic structure of R, G, and B become conspicuous, since respective color picture elements 18 of R, G, and B of the display image are projected with enlargement. This impairs the quality of the displayed image, disadvantageously.

In the present invention as mentioned above, divergence of the light fluxes at liquid crystal panel 2 is less, and sufficiently bright image can be projected onto a screen without conspicuousness of the mosaic structure of the R, G, and B even by use of a smaller numerical aperture of the projection lens. Thus a smaller projection lens can be used in the present invention.

Figure 29:
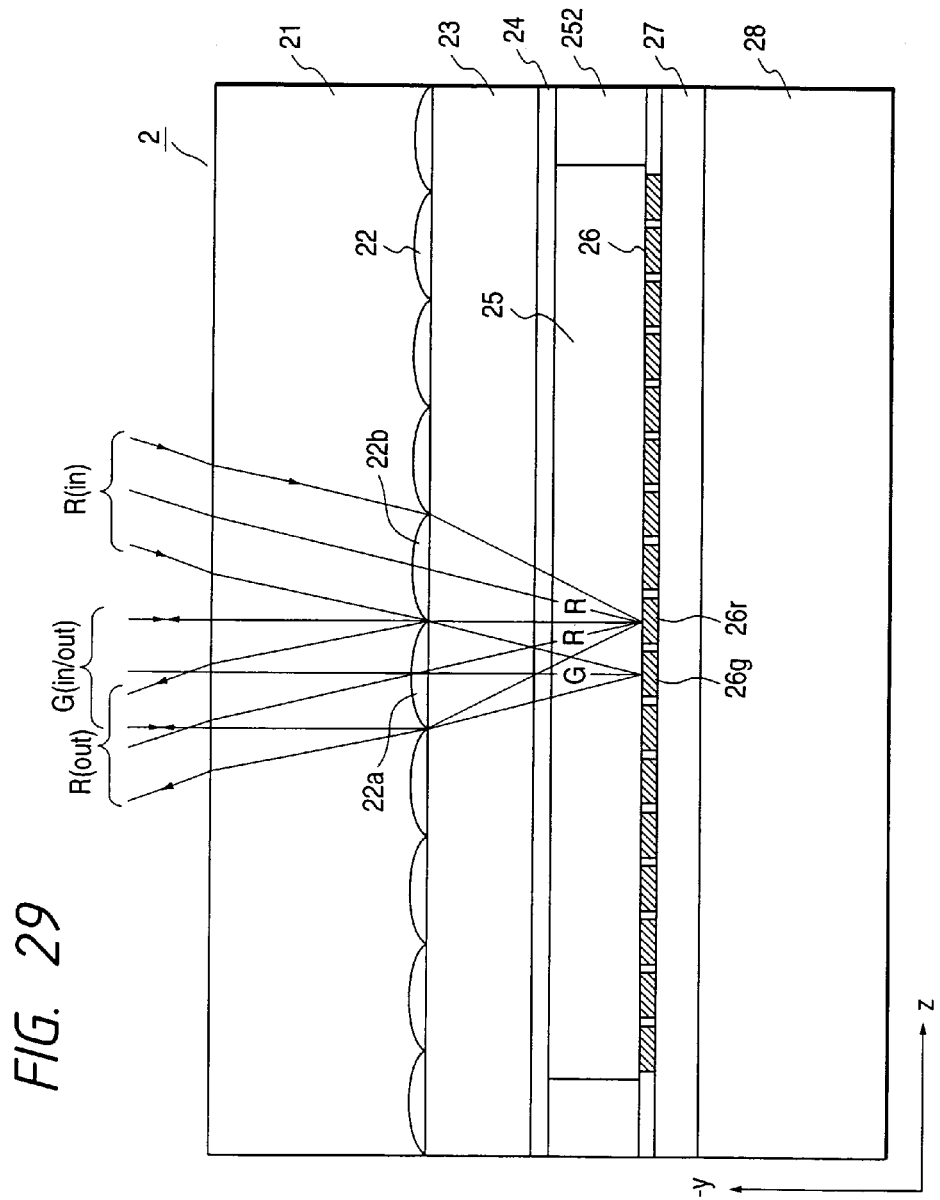
FIG. 29 is a sectional view of an example of a liquid crystal panel of the present invention.

Liquid crystal panel 2 of the present invention is explained below. FIG. 29 is a schematic enlarged sectional view of liquid crystal panel 2 of the present invention (corresponding to the y-z plane in FIG. 26C). In FIG. 29, the circuit in the horizontal direction characteristic to the present invention is omitted since it has been described in detail in other embodiments.

In FIG. 29, the numeral 21 denotes a microlens substrate (glass substrate); 22, a microlens; 23, a sheet glass; 24, a light-transmissive counter electrode; 25, a liquid crystal layer; 26, a picture element electrode; 27, an active matrix driving circuit; and 28, a silicon semiconductor substrate. Microlenses 22 are formed by an ion-exchange method on the surface of glass substrate (alkali type glass) 21, and are arranged two-dimensionally at a pitch twice as large as that of picture element electrodes 26 to form a microlens array.

Liquid crystal layer 25 employs ECB mode nematic liquid crystal such as DAP, and HAN suitable for the reflection type, and the prescribed alignment is maintained by alignment layer not shown in the drawing. Picture element electrodes 26 are formed from Al (aluminum), and simultaneously serves as reflection mirrors. Picture element electrodes 26 are treated for the aforementioned CMP at the final stage after patterning to improve the flatness and the reflectivity of the surface.

Active matrix driving circuit 27 is provided on silicon semiconductor substrate 28. Active matrix driving circuit 27 including a horizontal direction driving circuit and a vertical direction driving circuit is provided for writing of picture signals of primary colors of R, G, and B into prescribed picture elements of R, G, and B. Although the picture element electrodes 26 do not have a color filter, they are distinguished as R, G, and B picture elements by the primary color picture signals written in the above active matrix driving circuit 27, and constitute the R, G, and B picture element arrangement described later.

G Light of the illumination light to be directed to liquid crystal panel 2 is firstly explained. As described above, the main rays of the G light is polarized by PBS 3, and then introduced perpendicularly to liquid crystal panel 2. One of the light rays introduced to one microlens 22a, as an example, is shown by the arrow mark G (in/out) in FIG. 29. As shown in FIG. 29, the G ray is focused by microlens 22a and introduced to G picture element electrode 26g composed of Al, and is reflected and emitted therefrom through the same microlens 22a out of liquid crystal panel 2. By passing forward and backward through liquid crystal layer 25, the G ray (polarized) is modulated by the liquid crystal under the action of the electric field formed by signal voltage applied to the picture element electrode 26g between picture element electrode 26g and counter electrode 24, and emitted from liquid crystal panel 2 to return to PBS 3. The quantity of light reflected by PBS face 3a and directed to projection lens 1 depends on the degree of the modulation to cause dense and light gradation of display of the picture elements.

R light introduced in an oblique direction within the cross-section (y-z plane) in the drawing is also polarized by PBS 3, and then, for example, the R ray introduced to microlens 22b is focused thereby to illuminate R picture electrode 26r displaced from the position directly below microlens 22b as shown by the arrow mark R(in). The R light is reflected by picture element electrode 26r to be emitted out of liquid crystal 2 through adjacent microlens 22a (adjacent at −z direction) as shown by the arrow mark R(out). The G ray (polarized) is also modulated by the liquid crystal under the action of the electric field formed by signal voltage applied to the picture element electrode 26r between picture element electrode 26r and counter electrode 24, and emitted from liquid crystal panel 2 to return to PBS 3. Thereafter, the R light is projected by projection lens 1 as a part of the picture image light in the same process as the above G light.

Incidentally, in FIG. 29, the G light on G picture element electrode 26g and the R light on R picture element electrode 26r seems to overlap and interfere each other. However, this apparent overlapping is due to the schematically magnified thickness of liquid crystal layer 25. Practically, the thickness of liquid crystal layer 25 is about 5μ, which is very thin in comparison with thickness of sheet glass 23 of 50~100μ. Therefore, such light interference does not occur regardless of the picture element size.

Figure 30A:
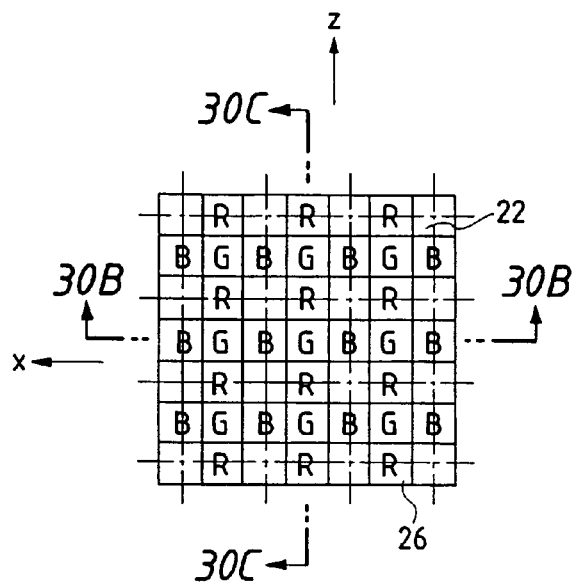
FIGS. 30A, 30B and 30C are drawings for explaining the principle of color separation and color synthesis in a liquid crystal panel of the present invention.
Figure 30C:
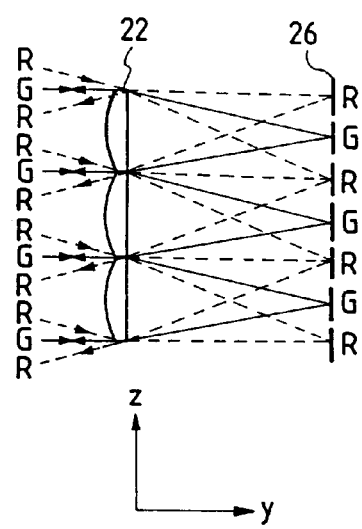
Figure 30B:
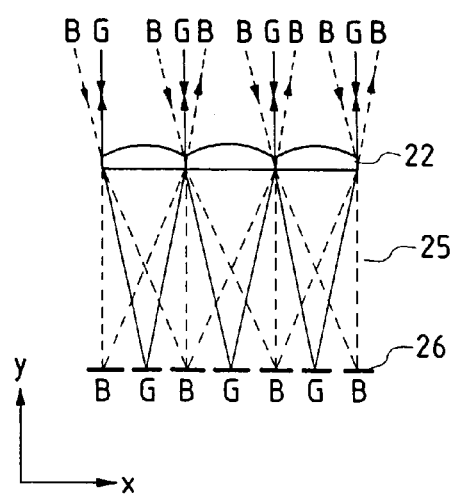

FIGS. 30A to 30C are diagrams for explaining principle of color decomposition and color synthesis in this embodiment. FIG. 30A is a schematic plan view of liquid crystal panel 2. FIG. 30B and FIG. 30C are respectively a schematic sectional view at 30B-30B (direction x) and at 30C-30C (direction z).

FIG. 30C corresponds to FIG. 29 showing the y-z section, and showing the states of introduction and emission of the G light and the R light to and from respective microlenses 22 for one pixel. As shown in the drawing, the respective G picture element electrodes as the first color picture elements are placed directly below the center of the respective microlenses 22, and the respective R picture element electrodes as the second color picture elements are placed directly below the boundaries between the respective microlenses 22. Therefore, the incident angle of the R light is preferably selected such that the tan θ of the incident angle θ is equal to the ratio of the picture element pitch (between B element and R element) to the distance between microlens 22 and picture element electrode 26.

FIG. 30B corresponds to the x-y cross-section of liquid crystal panel 2. In this x-y cross-section, the B picture element electrodes as the third color picture element and the G picture element electrodes are placed alternately in the same manner as in FIG. 30C, and the respective G picture element electrodes are placed directly below the center of the respective microlenses 22, and the respective R picture element electrodes as the third color picture elements are placed directly below the boundaries between the respective microlenses 22.

The B light which illuminates liquid panel 2, after polarization by PBS 3, is introduced obliquely in the cross-section (x-y plane). Therefore, the B light introduced through microlens 22 is reflected by the B picture element electrode in the same manner as the R light, and is emitted through the microlens adjacent in x direction to the one employed for the B light introduction as shown in the drawing. The modulation of B-light by liquid crystal layer 25 on B picture element electrodes, and projection of B-light from liquid crystal 2 are conducted in the same manner as aforementioned G light and R light.

The respective B picture element electrodes are placed directly below the boundaries between the respective microlenses 22. Therefore, the incident angle of the B light is preferably selected such that the tan θ of the incident angle θ is equal to the ratio of the picture element pitch (G and B elements) to the distance between microlens 22 and picture element electrode 26.

In liquid crystal panel 2 in this embodiment, the picture elements of R, G, and B are arranged as RGRGRG . . . in z direction (first direction) and BGBGBG . . . in x direction (second direction) as described above. FIG. 30A shows the planar arrangement of the picture elements.

The size of the picture element (color element) is approximately half of the size of microlens 22 both in vertical direction and in horizontal direction, and the pitch of the picture elements is also half of the pitch of microlens 22. The G picture element is placed just below the center of microlens 22 in plan view, the R picture element is placed between the G picture elements in z direction below the boundary between microlenses 22, and the B picture element is placed between the G picture elements in x direction below the boundary between microlenses 22. The shape of one microlens unit is rectangular (double the picture element size).

Figure 31:
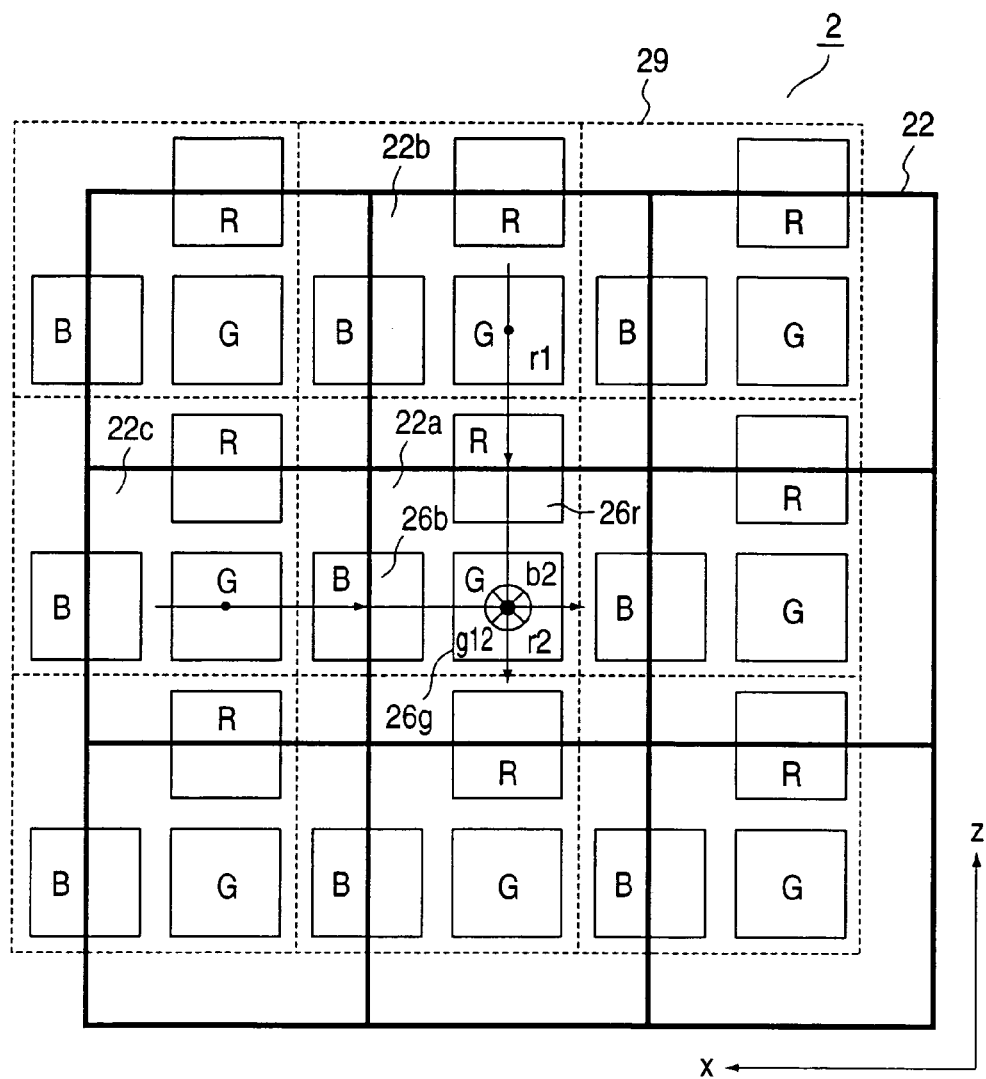
FIG. 31 is an enlarged plan view of an example of the liquid crystal panel of the present invention.

FIG. 31 is an enlarged plan view of a part of liquid crystal panel of this embodiment. The dotted lattice line 29 in the drawing shows groups of picture element units of R, G, and B for constituting respective image elements.

The picture element units are arranged two-dimensionally at a prescribed pitch on a substrate to constitute a picture unit array. In driving the respective R, G, and B picture elements by active matrix driving circuit 27 in FIG. 29, the picture element unit partitioned by the dotted lattice line 29 is driven by R, G, and B picture signals corresponding to one and the same picture element point.

In an image element constituted of R picture element electrode 26r, G picture element electrode 26g, and B picture element electrode 26b, R picture element electrode 26r is illuminated by R light introduced obliquely through microlens 22b as shown by arrow mark r1, and reflected R light is emitted through microlens 22a as shown by arrow mark r2 as described before. B picture element electrode 26b is illuminated by B light introduced obliquely through microlens 22c as shown by arrow mark b1, and reflected B light is emitted also through microlens 22a as shown by arrow mark b2 as described before. G picture element electrode 26g is illuminated by G light introduced perpendicularly (from front to backside of the drawing) through microlens 22a as shown by arrow mark g12 perpendicular to the drawing, and reflected G light is emitted through the same microlens 22a perpendicularly (to the front side of the drawing) as described before.

In such a manner, in liquid crystal panel 2, in R, G, and B picture element unit constituting one image element, the respective primary color illumination lights are introduced from different illumination position, but are emitted through one and the same microlens (microlens 22*a* in this case). This the same in all other image elements (R, G, B picture units).

Figure 32:
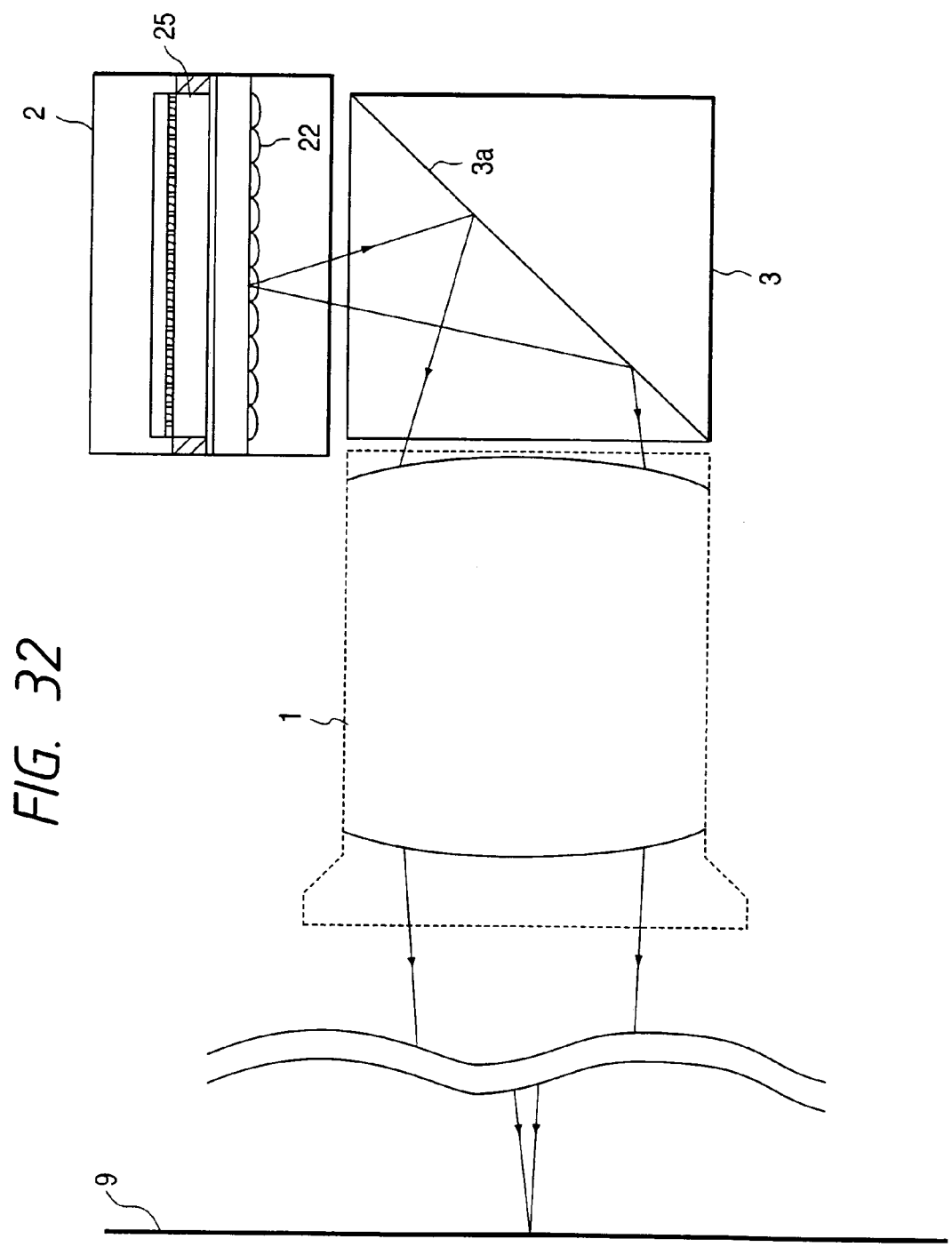
FIG. 32 is a schematic diagram of an optical system for projection of a projection type display apparatus of the present invention.
Figure 34:
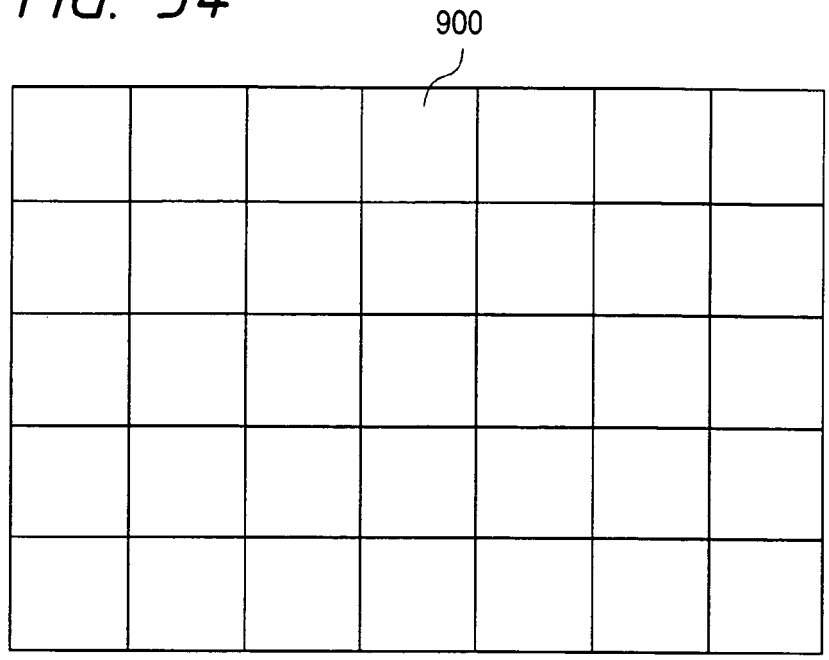
FIG. 34 is a diagram showing a part of enlarged projected image on a screen of an example of a projection type display apparatus of the present invention.

FIG. 32 shows schematically projection of the entire emitted light from liquid crystal panel 2 through PBS 3 and projection lens 1 onto screen 9. Liquid crystal panel 2 as shown in FIG. 31 is used. The optical system is adjusted to form, on screen 9, a projected image of the positions of microlenses 22 and vicinity thereof of liquid crystal panel 2. The projected image is constituted of image units, each unit being a mixture of color light emitted from R, G, and B picture units in lattice of microlenses 22, namely one picture element unit color mixture as shown in FIG. 34, numeral 900.

In this embodiment, with display panel 2 of FIG. 31, the plane of arrangement of microlens 22 and the vicinity thereof is adjusted to be in approximate conjugation with the screen to obtain high-quality color picture image display without R, G, B mosaic on the screen.

Figure 33:
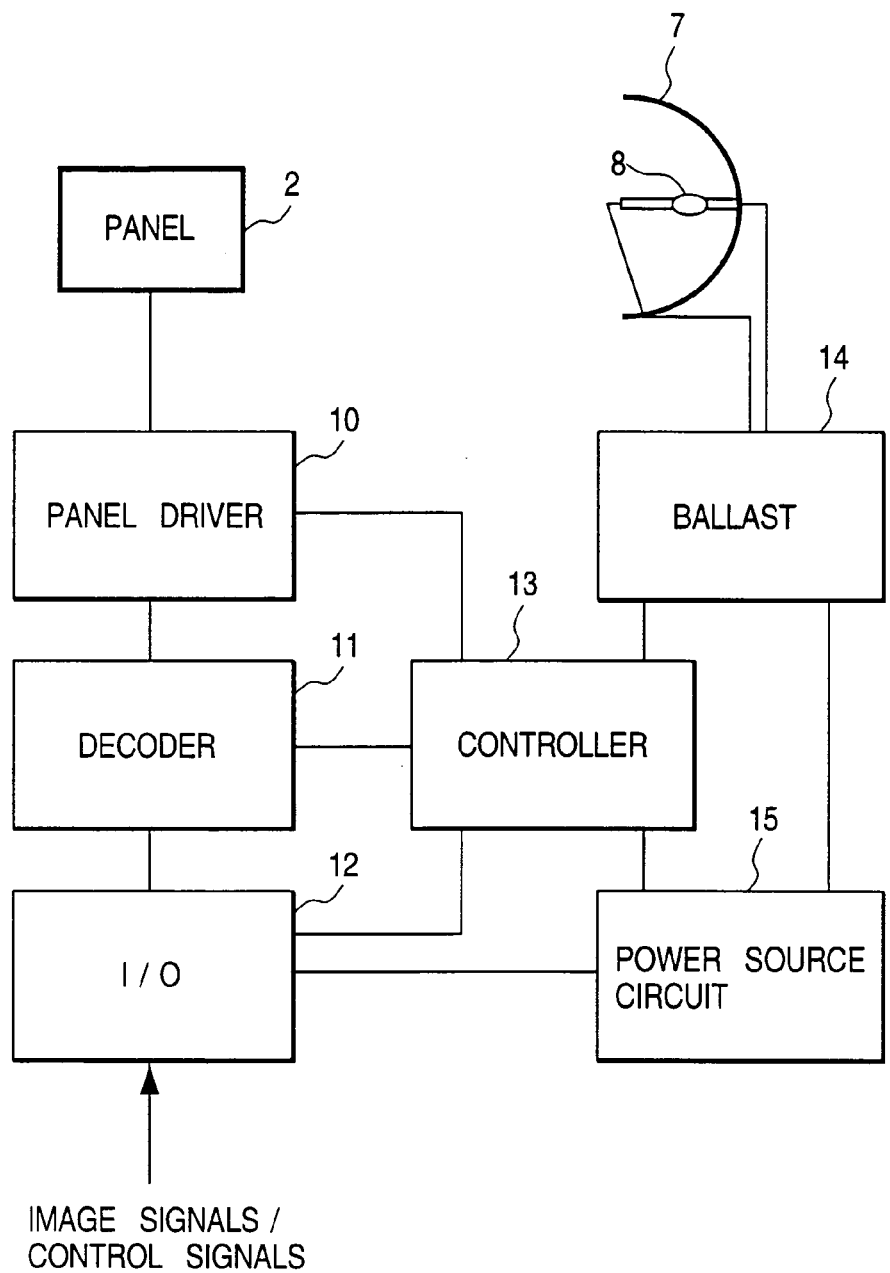
FIG. 33 is a block diagram showing a driving circuit system of a projection type display apparatus of the present invention.

FIG. 33 is a block diagram showing an entire driving circuit system of a projection type display apparatus of this embodiment. In FIG. 33, a panel driver 10 generates image signals of R, G, and B, and generates also signal for driving counter electrode 24, and various timing signals. Interface 12 decodes image signals and control transfer signals into reference image signals. Decoder 11 decodes the reference picture signals from interface 12 to picture signals and synchronization signals of primary colors of R, G, and B. Ballast 14 drives and turns on arc lamp 8. Power source circuit 15 applies electric power to respective circuit blocks. Controller 13 contains an operation system not shown in the drawing, and controls the above circuit blocks collectively.

Thus the projection type liquid crystal display apparatus of this embodiment is capable of displaying high-quality color picture image without R, G, B mosaic.

Figure 35:
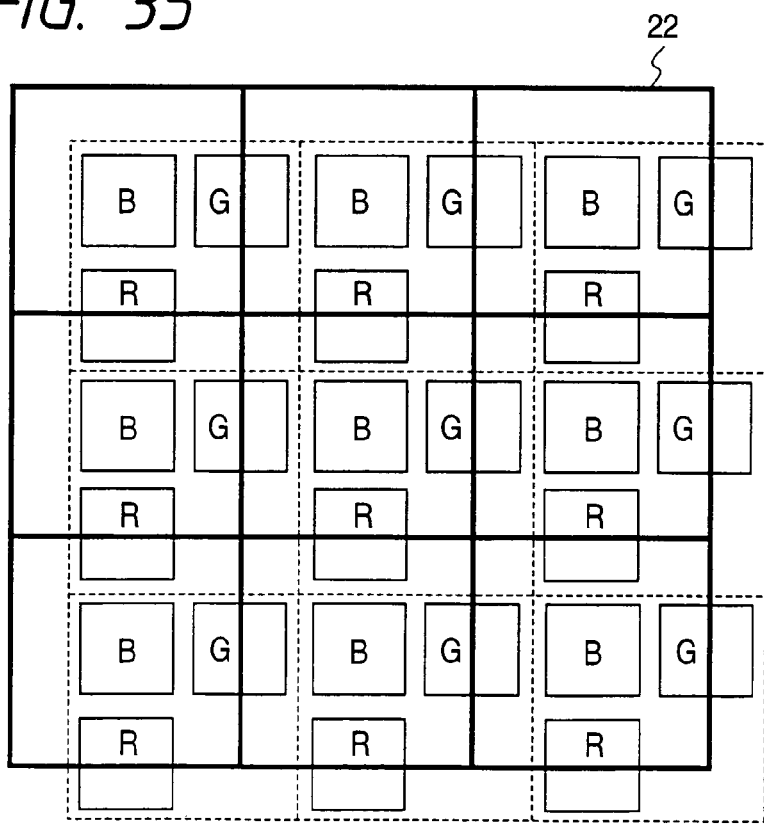
FIG. 35 is an enlarged partial plan view of an example of a liquid crystal display of the present invention.

FIG. 35 is an enlarged plan view of a part of another type liquid crystal panel of this embodiment. In this panel, B picture elements as first picture elements are arranged respectively just below the respective center of microlenses 22, and G picture elements as second picture elements are placed between the B picture elements to give alternate arrangement of B and G in the left-right direction, and R picture elements are placed in vertical direction between B picture elements to give alternate arrangement of B and R. In such an arrangement, the same effect as above example can be achieved by introducing B light perpendicularly and R light and G light obliquely (at the same angle in different direction) to allow the each color light reflected by the picture element units of R, G, and B to emit through one and the same microlens. Otherwise, R picture elements as the first color picture element are placed respectively just below the centers of microlenses 22, and picture elements of other colors are arranged alternately in left-right direction or vertical direction.

Tenth Embodiment

Another example of Ninth Embodiment is described below.

FIG. 36 is a schematic enlarged cross-sectional view of the main portion of liquid panel 20 of this example. This example is different from the one of Ninth Embodiment in that sheet glass 23 is employed as the counter substrate, microlenses 220 are formed from a thermoplastic resin by a reflow method on sheet glass 23, and spacer columns 251 are formed at non-picture element portion from a photosensitive resin by photolithography.

Figure 37A:
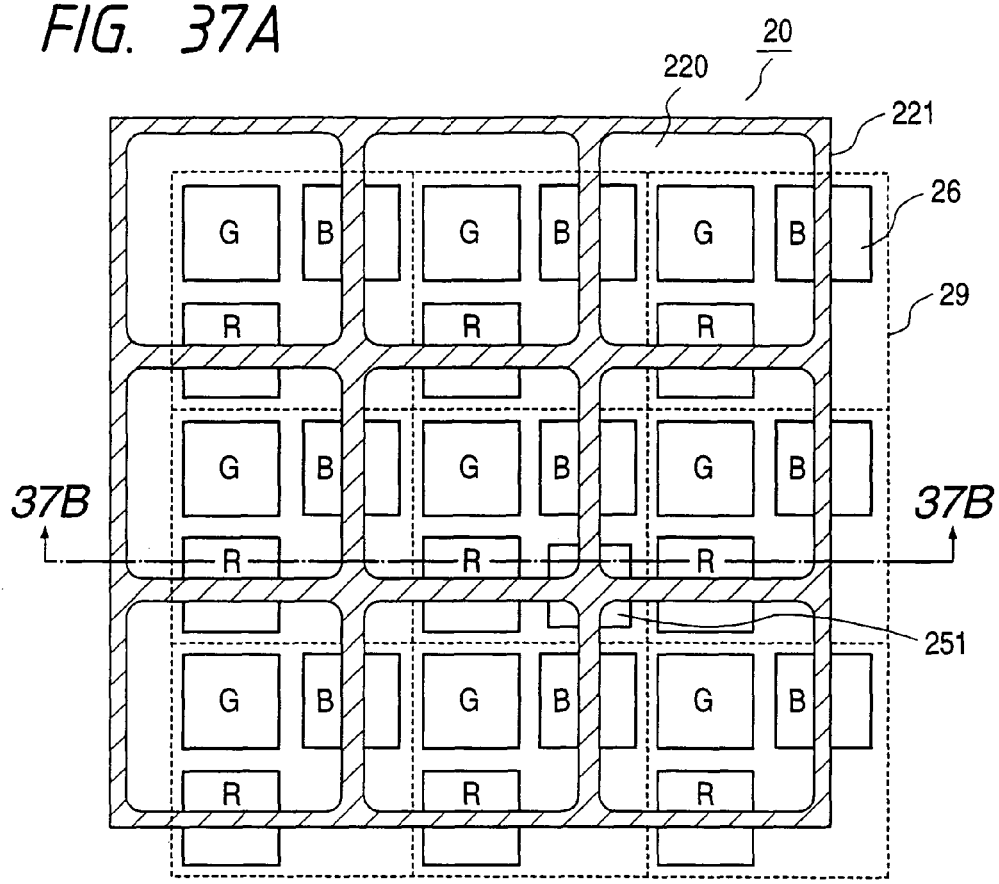
FIGS. 37A and 37B are respectively a partial enlarged plan view and a partial enlarged sectional view of an example of a liquid crystal panel of the present invention.
Figure 37B:
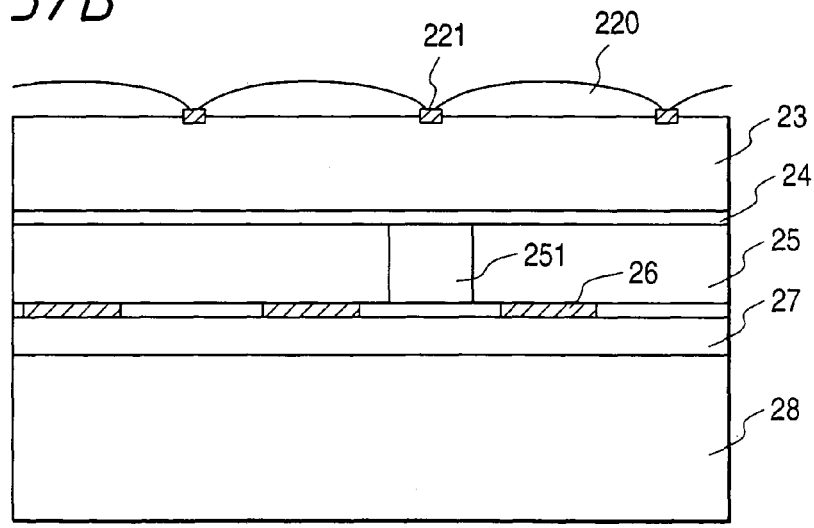

FIG. 37A is a partial plan view of liquid panel 20. In FIG. 37A, spacer columns 251 are formed in the same pitch as the picture elements at the non-picture element positions at the corner of microlenses 220. FIG. 37B is a sectional view taken along line 37B-37B passing the positions of columns 251. The spacer columns are preferably provided in matrix at a pitch of from 10 to 100 picture elements so that the contradictory parameters of flatness of sheet glass 23 and ease of filling of the liquid crystal are simultaneously satisfied.

Further in this example, light-intercepting layer 221 constituted of a metal film pattern is provided to prevent penetration of leak of light through the border portion of the microlenses. The light-interception prevents the drop of saturation of the projected picture image caused by light leakage (caused by mixing of the respective primary picture color), and drop of the contrast of the projected picture image. Accordingly, the projection type display apparatus constructed as in Ninth Embodiment employing liquid crystal panel 220 of this example gives more clear image of high quality.

As shown in First to Tenth Embodiments, the liquid crystal device of the present invention has advantages below: the number of parts of the external driving circuit can be reduced, the load to the picture signal lines can be reduced by employing digital input system in comparison with direct drive of the liquid crystal elements like the liquid crystal device of analog input system, the load to one D/A converter can be reduced and the time of writing into the liquid crystal elements can be lengthened to lower the driving frequency and to decrease power consumption as a whole of the liquid crystal device, finer image can be obtained owing to the less power consumption, and electric noise can be deceased to give high picture quality.

What is claimed is:

1. A driving apparatus for driving a display device which comprises a matrix substrate including a plurality of scanning lines, a plurality of signal lines intersecting the scanning lines and a plurality of picture elements each provided at an intersecting point of said scanning lines and said signal lines with interposition of a switching element to the signal lines, wherein the driving apparatus comprises:
   a vertical scanning circuit for supplying scanning signals to the scanning lines;
   first and second systems of latch circuits, the first system of latch circuits comprising plural first latch circuits, and the second system of latch circuits comprising plural second latch circuits;
   a horizontal scanning circuit for generating a synchronizing signal in a period of horizontal scanning to transfer a digital picture signal into selected ones of the first and second latch circuits;
   wherein the first and second systems of latch circuits alternate between memorizing the digital picture signal transferred into the selected latch circuits in the period of horizontal scanning and outputting the digital picture signal memorized in a previous period of horizontal scanning, such that one of the first and second systems of latch circuits memorizes the digital picture signal transferred in the period of horizontal scanning and the other of the first and second systems of latch circuits outputs the digital picture signal memorized in the previous period of horizontal scanning of the synchronizing signal;
   a plurality of D/A converters for receiving the digital picture signal alternately output from the first and second systems of latch circuits and for converting the received digital picture signal into an analog signal;
   transfer switches provided between each of the D/A converters and respective groups of the signal lines; and a selection circuit for selecting successive ones of the transfer switches so as to connect each respective one of the plurality of D/A converters to successive ones of the signal lines in the respective group of signal lines so as to transfer the analog signal to the connected signal line, wherein the digital picture signal is generated in a sequencing circuit by rearranging picture data in a source signal corresponding to the plurality of picture elements into a sequence of the picture data in an order of selection of the transfer switches, wherein a number of the D/A converters is equal to a number of the first latch circuits in the first system of latch circuits and is equal to a number of second latch circuits in the second system of latch circuits, wherein the number of D/A converters is equal to a number of signal lines divided by an integer whose value is two or more, and wherein the digital picture signal for a horizontal line of the picture elements is divided into the integer number of the digital picture signals, each of which is sequentially transferred into the latch circuits in the period of horizontal scanning.

2. The driving apparatus according to claim 1, wherein analog signals are applied to the signal lines through the transfer switches in every output of the selection circuit.

3. The driving apparatus according to claim 1, wherein the selection circuit is a shift register.

4. The driving apparatus according to claim 1, wherein the switching element comprises a p-channel MOS transistor and a n-channel MOS transistor.

5. The driving apparatus according to claim 1, wherein the matrix substrate comprises a changeover switch between each of the D/A converters and a number of the transfer switches for selecting one of at least two groups of the number of signal transfer switches to receive input from a corresponding D/A converter.

6. The driving apparatus according to claim 1, wherein the display device is the liquid crystal device.

7. The driving apparatus according to claim 1, wherein each D/A converter comprises at least two analog buffer circuits and a circuit for selecting one of the two buffer circuits.

8. The driving apparatus according to claim 1, wherein the display device comprises a reflection means as the liquid crystal device, and displays a picture image by introducing light emitted from a light source to the liquid crystal device, and projecting reflected light through an optical system onto a screen.

* * * * *